United States Patent
Lo et al.

(10) Patent No.: US 9,360,758 B2
(45) Date of Patent: Jun. 7, 2016

(54) SEMICONDUCTOR DEVICE PROCESS FILTER AND METHOD

(71) Applicant: Taiwan Semiconductor Manufacturing Company, Ltd., Hsin-Chu (TW)

(72) Inventors: Kuan-Hsin Lo, Caotun Township (TW); Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/452,263

(22) Filed: Aug. 5, 2014

(65) Prior Publication Data
US 2015/0160558 A1    Jun. 11, 2015

Related U.S. Application Data

(60) Provisional application No. 61/912,997, filed on Dec. 6, 2013.

(51) Int. Cl.
| | |
|---|---|
| *C03C 15/00* | (2006.01) |
| *G03F 7/30* | (2006.01) |
| *H01L 21/308* | (2006.01) |

(52) U.S. Cl.
CPC .............. *G03F 7/30* (2013.01); *H01L 21/3081* (2013.01)

(58) Field of Classification Search
CPC ..... G03F 7/028; G03F 7/0387; G03F 7/0382; G03F 7/0752; G03F 7/30; G03F 7/32; H01L 21/308
USPC .......... 216/41, 49, 51, 103; 430/285.1, 286.1, 430/355

See application file for complete search history.

(56) References Cited

U.S. PATENT DOCUMENTS

| | | | |
|---|---|---|---|
| 5,096,473 A | 3/1992 | Sassa et al. | |
| 5,507,959 A | 4/1996 | Glick | |
| 5,878,918 A | 3/1999 | Liao et al. | |
| 6,042,635 A | 3/2000 | Chung et al. | |

(Continued)

FOREIGN PATENT DOCUMENTS

| | | |
|---|---|---|
| KR | 20020092170 A | 12/2002 |
| KR | 1020070008550 A | 1/2007 |
| KR | 1020080014153 A | 2/2008 |

OTHER PUBLICATIONS entegris.com, Hydrophobic Cartridge and Disposable Filters (Datasheet, Installation and Use Manual, etc.) [online]. Entegris, Inc., Earliest known availability date as evidenced by Entegris, Inc. (See included Entegris.com screenshot): Jun. 29, 2011, retrieved on May 31, 2014.

(Continued)

*Primary Examiner* — Lan Vinh
(74) *Attorney, Agent, or Firm* — Slater Matsil, LLP

(57) ABSTRACT

In accordance with an embodiment, a method of filtering a process fluid such as a negative tone developer is provided. The negative tone developer is introduced to a filter membrane that comprises a fluorine-based polymer. The negative tone developer is then filtered through the filter membrane. By using these materials and methods, polyethylene from the filter membrane will not contaminate the photoresist during development and reduce defects that arise from polyethylene contamination.

20 Claims, 8 Drawing Sheets

(56) References Cited

U.S. PATENT DOCUMENTS

| | | | |
|---|---|---|---|
| 6,203,659 | B1 | 3/2001 | Shen et al. |
| 7,132,205 | B2 | 11/2006 | Rushkin et al. |
| 7,534,471 | B2 | 5/2009 | Klare et al. |
| 7,771,911 | B2 | 8/2010 | Hada et al. |
| 7,867,559 | B2 | 1/2011 | Taniguchi et al. |
| 7,882,962 | B2 | 2/2011 | Shibata et al. |
| 8,152,889 | B2 | 4/2012 | Choi |
| 8,211,624 | B2* | 7/2012 | Nakamura et al. ............ 430/312 |
| 8,282,713 | B2 | 10/2012 | Smithies et al. |
| 2002/0177081 | A1* | 11/2002 | Abe et al. .................. 430/314 |
| 2002/0187421 | A1 | 12/2002 | Hioki et al. |
| 2003/0215755 | A1* | 11/2003 | Lundy et al. ............... 430/331 |
| 2004/0224253 | A1* | 11/2004 | Arao .................. G03F 7/038 430/270.1 |
| 2006/0102554 | A1* | 5/2006 | Padmanaban et al. ..... 210/500.1 |
| 2006/0116493 | A1* | 6/2006 | Watanabe et al. ............ 526/268 |
| 2007/0144716 | A1* | 6/2007 | Doh et al. .................. 165/158 |
| 2008/0206668 | A1* | 8/2008 | Hoshino ............... G03F 7/0382 430/270.1 |
| 2008/0230492 | A1 | 9/2008 | Kao et al. |
| 2009/0092924 | A1* | 4/2009 | Muroi et al. ............... 430/285.1 |
| 2010/0040971 | A1 | 2/2010 | Tarutani et al. |
| 2010/0183851 | A1 | 7/2010 | Cao et al. |
| 2010/0320146 | A1 | 12/2010 | Krause et al. |
| 2014/0263053 | A1 | 9/2014 | Wang et al. |

OTHER PUBLICATIONS

Meyyappan, et al., Process Control, Diagnostics, and Modelling in Semiconductor Manuacturing 226 (1997).

Kaelble, D.H. et al., "Dispersion and Polar Contributions to Surface Tensions of Poly(methylene Oxide) and Na-Treated Polytetrafluoroethylene," Revised Aug. 17, 1970, Journal of Polymer Science: Part A-2, vol. 9, pp. 363-368 (1971).

Kuckzkowski, Robert L. et al., "Microwave Spectrum, Structure, and Dipole Moment of Sulfuric Acid," Received Oct. 13, 1980, vol. 103, Journal of American Chemical Society, 1981, pp. 2561-2566.

Maryott, Arthur A., "Electric Polarization and Association in Solution. III. The Dipole Moments of Some Alcohols in Very Dilute Benzene Solutions," Received Aug. 1, 1941, 63 Journal American Chemical Society (1941) pp. 3079-3083.

McDonnell, Gerald et al., "Antiseptics and Disinfectants: Activity, Action, and Resistance," Clinical Microbiology Reviews, vol. 12, No. 1, (Jan. 1999), pp. 147-179, American Society for Microbiology.

Merriam-Webster, alkane (Datasheet, Definition, etc.) [online]. Dictionary.com, LLC, Earliest known availability date as evidenced x by m-w.com: 1899, retrieved on May 31, 2014 from <URL: http://www.merriamwebster.com/dictionary/alkane>.

Myhre, Cathrine E. L. et al., "Density and Surface Tension of Aqueous H2SO4 at Low Temperature," Journal of Chemical & Engineering Data, vol. 43, No. 4, Jun. 5, 1998, pp. 617-622, American Chemical Society, doi:10.1021 /je980013g.

Owens, D. K. et al., "Estimation of the Surface Free Energy of Polymers," Journal of Applied Polymer Science, vol. 13, No. 8 (Aug. 1, 1969), pp. 1741-1747; doi: 10.1002/app.1969.070130815.

Reinhardt, Karen A. et al.. Handbook for Cleaning for Semiconductor Manufacturing: Fundamentals and Applications, John Wiley & Sons, 2011, pp. 31-34.

Richards, Theodore W. et al. "The Surface Tensions of Water, Methyl, Ethyl and Isobutyl Alcohols, Ethyl Butyrate, Benzene and Toluene," Journal of the American Chemical Society 37, No. 7 (Jul. 1, 1915), pp. 1656-1676, DOI:10.1021/ja02172a002.

Smallwood, Ian, Handbook of Organic Solvent Properties, 187 (1996).

Huber, Walter, Titrations in Nonaqueous Solvents, p. 208, Academic Press, New York, 1967.

Korean Office Action received in Application No. 10-2014-0172959, mailed Jan. 20, 2016, 10 pages.

* cited by examiner

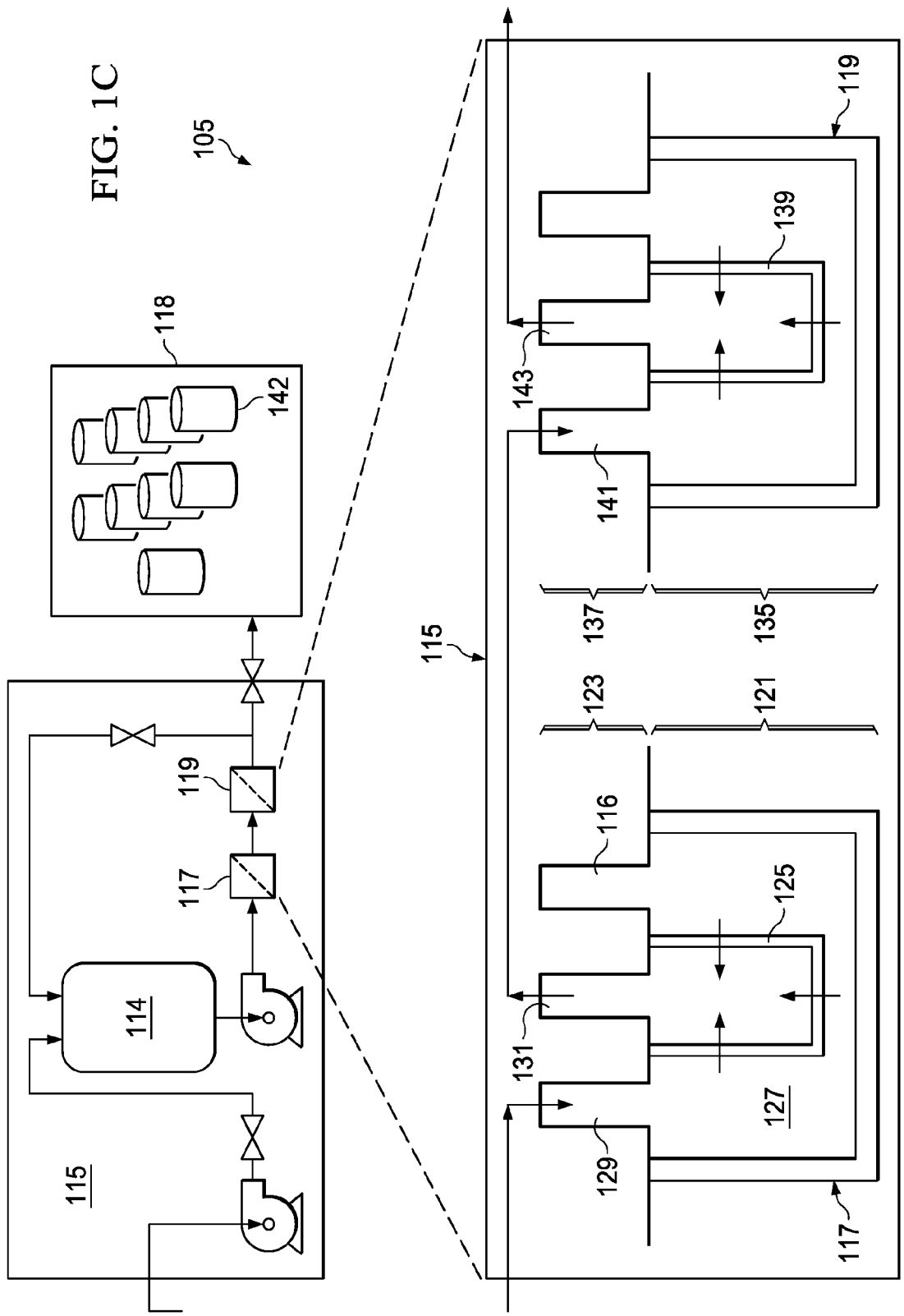

SEMICONDUCTOR DEVICE PROCESS FILTER AND METHOD

PRIORITY CLAIM AND CROSS-REFERENCE

This application claims priority to U.S. Provisional Application No. 61/912,997, filed on Dec. 6, 2013, and entitled "Method for Defect Reduction and Resulting Structures," which application is incorporated herein by reference.

BACKGROUND

In a semiconductor manufacturing process, semiconductor chips may be manufactured having devices such as transistors, resistors, capacitors, inductors, and the like formed therein. The manufacture of semiconductor chips may involve many processing steps, which may include combinations of photolithography, ion implantation, doping, annealing, packaging, etc. Many types of fluids may be used in these processes including water, dielectrics, polymers, photoresists, chemical etchants, acids, etc. These fluids are filtered and passed to manufacturing equipment, which uses the fluids during the manufacture of semiconductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1D illustrate a life cycle of a negative tone developer in accordance with some embodiments;

DETAILED DESCRIPTION

Figure 1A:
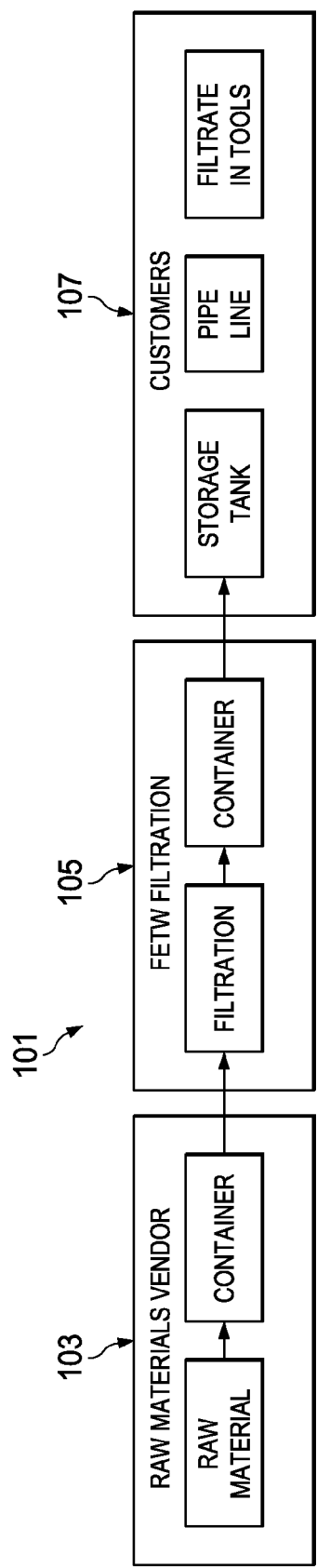

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1A, there is shown a life-cycle process flow for the manufacture and use of a negative tone developer 101. In an embodiment the process flow comprises three distinct sections, a raw materials manufacturing section 103, a filtration section 105, and a delivery to and use by a customer section 107. Each of these sections is described in greater detail below with respect to FIG. 1B, FIG. 1C, and FIG. 1D, respectively.

In an embodiment the negative tone developer 101 may be chosen to be used in conjunction with a photoresist 207 (not illustrated in Figure 1A but illustrated and described below with respect to FIG. 2) in order to form a negative tone pattern within the photoresist 207. In an embodiment the negative tone developer 101 may be an organic solvent or critical fluid may be utilized to remove those portions of the photoresist 207 which were not exposed during an exposure process. Specific examples of materials that may be utilized include hydrocarbon solvents, alcohol solvents, ether solvents, ester solvents, critical fluids, combinations of these, or the like. Specific examples of materials that can be used for the negative tone solvent include hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like. However, any suitable material may alternatively be utilized.

Figure 1B:
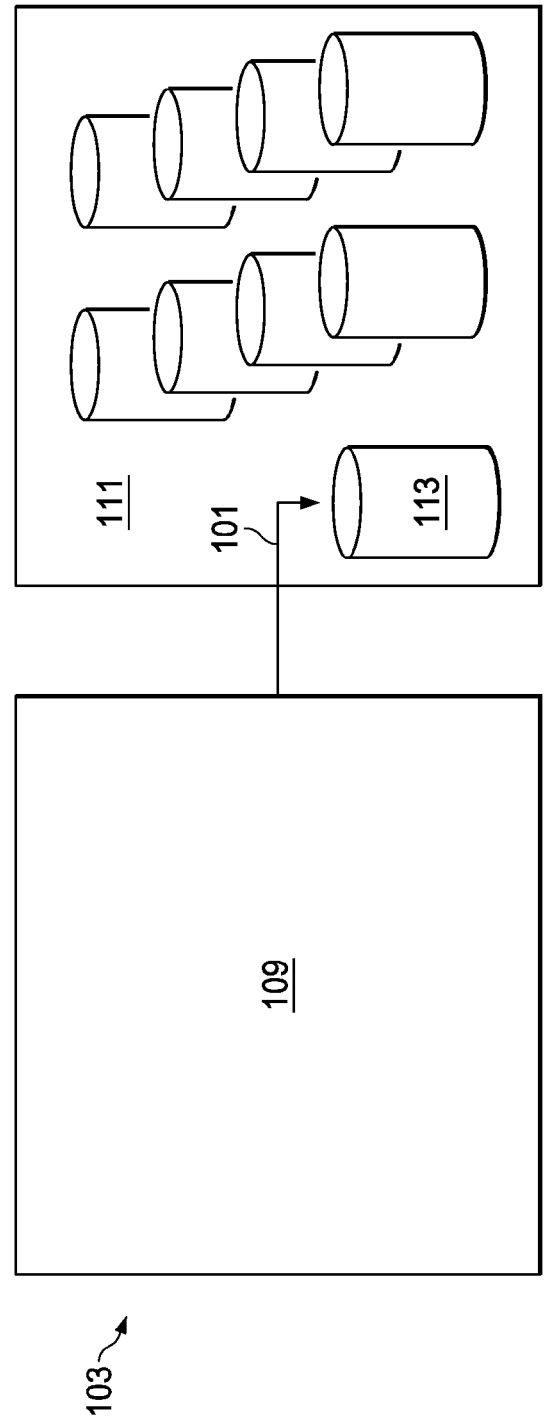

Looking next at FIG. 1B, a simplified diagram of the raw materials manufacturing section 103 is illustrated. In particular, the raw materials manufacturing section 103 further comprises a raw material manufacturing section 109 and a raw material manufacturing storage section 111. In an embodiment the raw material manufacturing section 109 comprises equipment that is utilized to create and purify the negative tone developer 101. As such, the precise manufacturing and separation equipment that may be used is dependent at least in part upon the material chosen for the negative tone developer 101.

Once manufactured and purified, the negative tone developer 101 may then be stored within the raw material manufacturing storage section 111 of the raw materials manufacturing section 103 using, e.g., first containers 113. In an embodiment the first containers 113 may be any suitable type of containers, such as a canister, a holding tank, a pressure vessel, drums, etc. that may be used to reliably store and contain the negative tone developer 101 while reducing or eliminating the loss, either through evaporation or chemical reaction of the negative tone developer 101 until it is time to either further process the negative tone developer 101 or else ship the negative tone developer 101 to, e.g., a customer.

In a particular embodiment the first containers 113 may be canisters utilized for the easy transport of the negative tone developer 101. In this embodiment the first containers 113 may comprise a material that is free from polyethylene or high density polyethylene. For example, in an embodiment the first containers 113 may be a fluorine-based polymer, such as polytetrafluorethylene (PTFE), perfluoroalkoxy (PFA), fluorinated ethylene propylene (FEP), poly-ethene-co-tetrafluoroethene (ETFE), poly(vinylidene fluoride) (PVDF), combinations of these, or the like. However, by removing polyethylene as a component within the raw material storage section 111 and using a fluorine-base polymer, the negative tone developer 101 (which may be strongly hydrophobic) will not come into contact with, e.g., oligomers within the surrounding materials, and the polyethylene may be prevented from contaminating the negative tone developer 101 and winding up on the photoresist 207 during use.

In an embodiment in which the first containers 113 comprise a fluorine-based polymer material, a significant reduction in the number of defects may be observed from using a material such as high density polyethylene (HDPE) for the first containers 113. In a particular embodiment in which PTFE is used, the level of wet particle can be further improved when HDPE is switched for PTFE in the first containers 113.

FIG. 1C illustrates that, after the negative tone developer 101 has been manufactured and stored, the negative tone developer 101 may be filtered within the filtration section 105 in order to remove particles and other contaminants that may harm or otherwise deteriorate devices which the negative tone developer 101 is used to manufacture. In an embodiment the filtration section 105 may comprise a filter section 115 and a filtration storage section 118 to store the negative tone developer 101 after the negative tone developer 101 has been filtered. The filtration section 105 may be located either within the raw materials manufacturing section 103 or, alternatively, the filtration section 105 may be located separately from the raw materials manufacturing section 103.

In an embodiment the filtration section 105 comprises a first tank 114 to hold the negative tone developer 101 from the raw materials manufacturing section 103, and also comprises a first filter 117 and a second filter 119 (shown both in line and also in an expanded view in FIG. 1C) in series in order to filter the contaminants out of the negative tone developer 101. In an embodiment the first filter 117 may include a first filter basin 121, a first filter cap 123, and a first filter membrane 125. The first filter basin 121 may be any desired shape that may be suitable for contacting the negative tone developer 101 with the first filter membrane 125. In the embodiment illustrated in FIG. 1C, the first filter basin 121 has a cylindrical sidewall and a bottom. However, the first filter basin 121 is not limited to a cylindrical shape, and any other suitable shape, such as a hollow square tube, an octagonal shape, or the like, may alternatively be utilized. Furthermore, the first filter basin 121 may be surrounded by a first housing 127 made of material that is inert to the various process materials. As such, while the first housing 127 may be any suitable material that can withstand the chemistries and pressures involved in the process, in an embodiment the first housing 127 may be steel, stainless steel, nickel, aluminum, alloys of these, combinations of these, and like.

The first filter basin 121 may also have a first filter cap 123 to enclose the first filter basin 121. The first filter cap 123 may be attached to the first housing 127 utilizing, e.g., a seal such as an o-ring, a gasket, or other sealant in order to prevent leakage from the first filter basin 121 while at the same time allowing the first filter cap 123 to be removed for access to the first filter basin 121 within the interior of the first housing 127. Alternatively, the first filter cap 123 may be attached by welding, bonding, or adhering the first filter cap 123 to the first housing 127 in order to form an air-tight seal and prevent any leakage.

A first inlet port 129 and a first outlet port 131 may provide access to the first filter basin 121 in order to receive the negative tone developer 101 and output a filtered negative tone developer 101, respectively. The first inlet port 129 and the first outlet port 131 may be formed in the first filter cap 123 of the first filter basin 121 (as illustrated in FIG. 1C) or may alternatively be formed through the sidewalls of the first filter basin 121. In an embodiment the first inlet port 129 and the first outlet port 131 may also include various valves and fittings (not shown for clarity) to facilitate removal and replacement of the first filter basin 121.

The first filter cap 123 may also include a first vent port 116. The first vent port 116 may be used to controllably vent process gases that may arise either during maintenance of the first filter 117 or else during emergency conditions in order to controllably relieve pressure that may build up in the first filter 117. The first vent port 116 may also include various valves and fittings (not shown for clarity) in order to facilitate installation or operation of the first vent port 116.

The first filter membrane 125 may be used to filter the negative tone developer 101 that passes from the first tank 114 into the first filter basin 121 through the first inlet port 129, through the first filter membrane 125, and out of the first filter basin 121 through the first outlet port 131. In an embodiment the first filter membrane 125 is located between the first inlet port 129 and the first outlet port 131 so that the negative tone developer 101 has to pass through the first filter membrane 125 prior to leaving the first filter basin 121.

In an embodiment the first filter membrane 125 may be used to filter particles of greater than about 50 nm from the negative tone developer 101. As such, the first filter membrane 125 may have a pore size of 50 nm or less, and may be made from a material such as polytetrafluorethylen (PTFE), Fluorinated ethylene propylene (FEP), Perfluoroalkoxy (PFA), poly(ethene-co-tetrafluoroethene) (ETFE) and Poly (vinylidene fluoride) (PVDF). However, any other suitable material that will not leach polyethylene into the negative tone developer 101 may alternatively be used.

After the negative tone developer 101 has been filtered through the first filter 117 through, e.g., the first outlet port 131, the negative tone developer 101 may be sent to the second filter 119 to remove even smaller contaminants from the negative tone developer 101. In an embodiment the second filter 119 may have a second filter basin 135, a second filter cap 137, a second inlet port 141, and a second outlet port 143, and these may be similar to the first filter basin 121, the first filter cap 123, the first inlet port 129, and the first outlet port 131, although they may alternatively be different as well.

The second filter 119 may also comprise a second filter membrane 139 in order to filter the contaminants from the negative tone developer 101. However, in an embodiment the second filter membrane 139 is not the same as the first filter membrane 125. Rather, the second filter membrane 139 has a pore size that is smaller than the first filter membrane 125 in order to remove smaller contaminants from the negative tone developer 101. As such, while the pore size of the second filter membrane 139 is dependent at least in part upon the pore size of the first filter membrane 125, in an embodiment in which the first filter membrane 125 has a pore size of 50 nm (as described above), the second filter membrane 139 may have a pore size of between about 1 nm and about 30 nm, such as about 10 nm.

Additionally, the second filter membrane 139 may be formed using a material that is free from polyethylene in order to reduce or eliminate any leaching of polyethylene from the second filter 119 into the negative tone developer 101. In an embodiment the second filter membrane 139 may comprise a fluorine-based polyhmer material such as polytetrafluorethylene (PTFE), perfluoroalkoxy (PFA), fluorinated ethylene propylene (FEP), poly-ethene-co-tetrafluoroethene (ETFE), poly(vinylidene fluoride) (PVDF), combinations of these, or the like. However, any other suitable material may alternatively be utilized.

In a particular embodiment in which the second filter membrane 139 comprises PTFE, leaching of alkanes with less than sixteen carbon atoms (which may be seen as a substitute for polyethylene) can be kept below detection limits. This has been observed in tests whereby a filter with a filter membrane of PTFE is soaked. Over time, while other filter membrane materials such as UPE observe a detectable and noticeable leaching of the alkanes, the filter that comprises PTFE as a filter material had no detectable alkane leaching. As such, the use of such a filter helps to prevent or eliminate leaching of polyethylene during the filtering process and helps prevent defects during the overall semiconductor manufacturing process.

Once the negative tone developer 101 has been filtered through the second filter 119, the negative tone developer 101 may be sent to the filtration storage section 118, where it may be held until ready to be sent to a customer (in an embodiment in which the filtration section 105 is not at the customer's site) or else is ready to be used by the customer (in an embodiment in which the filtration section 105 is located at the customer's site). In an embodiment the filtration storage section 118 comprise second containers 142 similar to the first containers 113. For example, the second containers 142 may be storage tanks, pressure vessels, drums, or the like, made out of a material that does not have polyethylene in it, such as polytetrafluoroethylene (PTFE), perfluoroalkoxy (PFA), fluorinated ethylene propylene (FEP), poly-ethene-co-tetrafluoroethene (ETFE), poly(vinylidene fluoride) (PVDF), combinations of these, or the like. By utilizing these materials, leaching of polyethylene into the negative tone developer may be reduced or eliminated.

Additionally, while not discussed in detail, the filtration section 105 may additionally comprise other equipment such as pumps, valves, and cycle lines that may aid or assist in the movement or efficiency of the filtration of the negative tone developer 101 through the filtration section 105. Some, but not necessarily all, of these pieces of equipment are illustrated in FIG. 1C, but all such additional pieces of equipment are fully intended to be included within the scope of the embodiments.

By utilizing fluorine-based polymers for the second containers 142, the storage of the negative tone developer 101 may be kept free from leaching materials such as polyethylene for weeks. For example, storing the negative tone developer in a 200 liter PFA drum was tested and, after two weeks, defects were kept at an acceptable minimum.

Figure 1D:
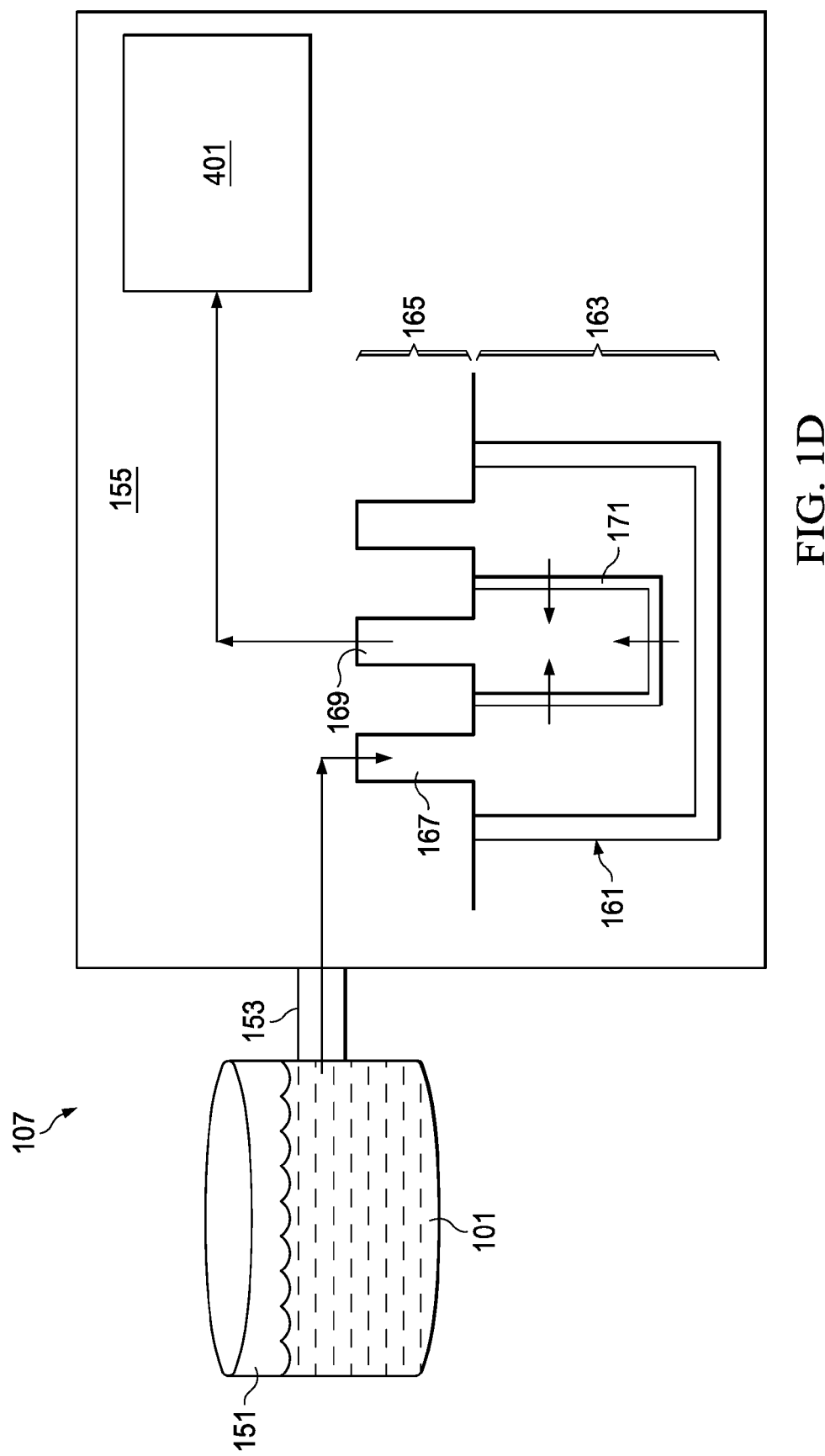

FIG. 1D illustrates that, once the negative tone developer 101 is ready to be used within a semiconductor manufacturing process, the negative tone developer 101 may be removed from the filtration storage section 118 and placed into a first process tank 151. In an embodiment the negative tone developer 101 may be removed by shipping, pumping, or otherwise transporting the negative tone developer 101 out of the filtration storage section 118 and towards the customer section 107, where it may be initially stored in a first process tank 151.

In an embodiment the first process tank 151 is a tank utilized to hold the filtered negative tone developer 101 until the process is ready to utilize the negative tone developer 101 as one of the steps within a semiconductor manufacturing process. In an embodiment the first process tank 151 is sized in order to hold a suitable quantity of the negative tone developer 101 so that enough negative tone developer 101 is ready without causing delays during the semiconductor manufacturing process, such as by having a volume of between about 4 L and about 10000 L, such as about 200 L.

Additionally, the first process tank 151 may be made from a material that is both inert to the negative tone developer 101 and also prevents any leaching of polyethylene into the negative tone developer 101 while the first process tank 151 is holding the negative tone developer 101. In an embodiment the first process tank 151 may comprise a material such as polytetrafluoroethylene (PTFE), perfluoroalkoxy (PFA), fluorinated ethylene propylene (FEP), poly-ethene-co-tetrafluoroethene (ETFE), poly(vinylidene fluoride) (PVDF), combinations of these, or the like, although any suitable material may alternatively be utilized.

When ready, the negative tone developer 101 is removed from the first process tank 151 using, e.g., a first pump (not individually illustrated in FIG. 1D) to pump the negative tone developer 101 out of the first process tank 151. However, while the first pump is one suitable method for removing the negative tone developer 101, it is intended to merely be an illustrative example. Any other suitable method, including introducing a pressurized, non-reactive gas into the first process tank to push the negative tone developer 101 out of the first process tank 151, may alternatively be used, and all such methods are fully intended to be included within the scope of the embodiments.

In an embodiment the negative tone developer 101 leaves the first process tank 151 and enters a pipe 153 towards a piece of process equipment 155. The pipe 153 may be one or more series of tubes, pumps, valves, and the like that control the negative tone developer 101 on its path from the first process tank 151 to the piece of process equipment 155. In addition, the pipe 153 may also comprise a material that reduces or eliminates leaching of polyethylene into the negative tone developer 101. In an embodiment the pipe 153 may comprise polytetrafluoroethylene (PTFE), perfluoroalkoxy (PFA), fluorinated ethylene propylene (FEP), poly-ethene-co-tetrafluoroethene (ETFE), poly(vinylidene fluoride) (PVDF), combinations of these, or the like, although any suitable material may alternatively be utilized.

Finally, the negative tone developer 101 is routed to the piece of process equipment 155. In an embodiment the piece of process equipment 155 may be a negative tone developer station 401 (not illustrated in detail in FIGS. 1A-1D but illustrated and described in detail below with respect to FIGS. 4A-4B), which utilizes a spin-on process to dispense the negative tone developer 101. However, any other suitable piece of process equipment, such as dip station or a puddle station, may alternatively, be used, and all such pieces of process equipment are fully intended to be included within the scope of the embodiments.

As part of the piece of process equipment 155, a third filter 161 may be used to provide a last filtration of the negative tone developer 101 prior to its use within the semiconductor manufacturing process. In an embodiment the third filter 161 may have a third filter basin 163, a third filter cap 165, a third inlet port 167, and a third outlet port 169, and these may be similar to the first filter basin 121, the first filter cap 123, the first inlet port 129, and the first outlet port 131, although they may alternatively be different as well.

The third filter 161 may also comprise a third filter membrane 171 in order to filter the contaminants from the negative tone developer 101. As the filter immediately prior to use, the third filter 161 is used to filter the final particles of contamination before the actual use of the negative tone developer 101 and, as such, has a pore size of between about 1 nm and about 30 nm, such as about 10 nm. However, any suitable pore size may alternatively be utilized.

Additionally, the third filter membrane 171 may be formed using a material that is free from polyethylene in order to reduce or eliminate any leaching of polyethylene from the third filter 161 into the negative tone developer 101. In an embodiment the third filter membrane 171 may comprise a fluorine-based polymer material such as polytetrafluoroethylene (PTFE), perfluoroalkoxy (PFA), fluorinated ethylene propylene (FEP), poly-ethene-co-tetrafluoroethene (ETFE), poly(vinylidene fluoride (PVDF), combinations of these, or the like. However, any other suitable material may alternatively be utilized.

Once the negative tone developer 101 has been filtered through the third filter 161, the negative tone developer 101 may be sent to the remainder of the piece of process equipment 155. In an embodiment the remainder of the piece of process equipment 155 comprises a negative tone developer station that uses a spin-on process (not illustrated in detail in FIG. 1D but illustrated and described in detail below with respect to FIGS. 4A-4B). However, any other suitable piece of process equipment may alternatively be utilized.

Figure 2:
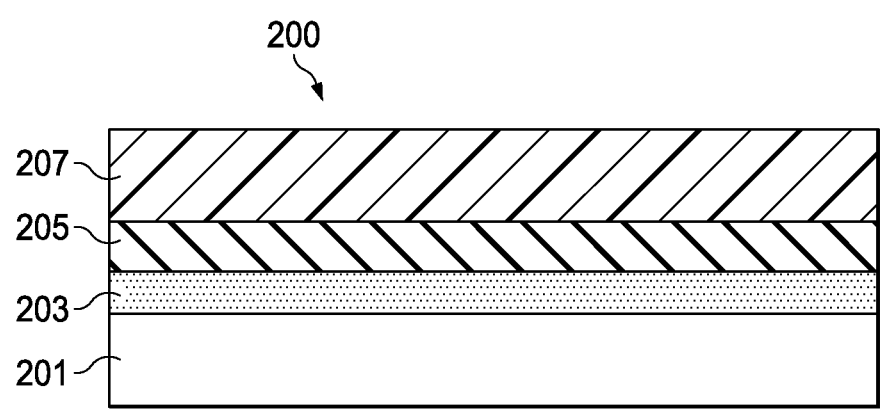
FIG. 2 illustrates a substrate with a photoresist over the substrate in accordance with some embodiments.

FIGS. 2-7 illustrate a semiconductor manufacturing process in which the negative tone developer 101 is utilized to form a negative tone pattern on a semiconductor device 200. With reference now to FIG. 2, there is shown a semiconductor device 200 with a substrate 201 and a bottom anti-reflective coating (BARC) layer 203, an intermediate mask layer 205, and a photoresist 207 applied over the substrate 201. The substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The BARC layer 203 is applied over the substrate 201 in preparation for an application of a photoresist 207. The BARC layer 203, as its name suggests, works to prevent the uncontrolled and undesired reflection of energy (e.g., light) such as light back into the overlying photoresist 207 during an exposure of the photoresist 207, thereby preventing the reflecting light from causing reactions in an undesired region of the photoresist 207. Additionally, the BARC layer 203 may be used to provide a planar surface over the substrate 201, helping to reduce the negative effects of the energy impinging at an angle.

In an embodiment the BARC layer 203 comprises a polymer resin, a catalyst, and a cross-linking agent, all of which are placed into a solvent for dispersal. The polymer resin comprises a polymer chain with repeating units, the other repeating resins may comprise a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, nitrogen, sulfur, or combinations thereof, such as pyrrolidinyl, pyranyl, piperidinyl, acridinyl, quinolinyl. The substituents in these units may be any hydrocarbyl group and may further contain heteroatoms, such as, oxygen, nitrogen, sulfur, or combinations thereof, such as alkylenes, ester, ethers, combinations of these, or the like, with a number of carbon atoms between 1 and 12.

In specific embodiments the monomers with chromophore units include styrene, hydroxystyrene, acetoxystyrene, vinyl benzoate, vinyl 4-tert-butylbenzoate, ethylene glycol phenyl ether acrylate, phenoxypropyl acrylate, N-methyl maleimide, 2-(4-benzoyl-3-hydroxyphenoxy)ethyl acrylate, 2-hydroxy-3-phenoxypropyl acrylate, phenyl methacrylate, benzyl methacrylate, 9-anthracenylmethyl methacrylate, 9-vinylanthracene, 2-vinylnaphthalene, N-vinylphthalimide, N-(3-hydroxyl)phenyl methacrylamide, N-(3-hydroxy-4-hydroxycarbonylphenylazo)phenyl methacrylamide, N-(3-hydroxyl-4-ethoxycarbonylphenylazo)phenyl methacrylamide, N-(2,4-dinitrophenylamino phenyl)maleimide, 3-(4-acetoaminophenyl)azo-4-hydroxystyrene, 3-(4-ethoxycarbonylphenyl)azo-acetoacetoxy ethyl methacrylate, 3-(4-hydroxyphenyl)azo-acetoacetoxy ethyl methacrylate, tetrahydroammonium sulfate salt of 3-(4-sulfophenyl)azoacetoacetoxy ethyl methacrylate combinations of these, or the like. However, any suitable monomer with chromophore units to absorb the impinging light and prevent the light from being reflected may alternatively be used, and all such monomers are fully intended to be included within the scope of the embodiments.

The cross-linking monomer may be used to cross-link the monomer with other polymers within the polymer resin modify the solubility of the BARC layer 203, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like. Specific examples of cross-linking monomers that may be utilized include polyhydroxystyrene, poly(hydroxynaphthalene), poly(metha)crylates, polyarylates, polyesters, polyurethanes, alkyd resins (aliphatic polyesters), poly(hydroxystyrene-methylmethacrylate), homopolymers and/or copolymers obtained by polymerization of at least one of the following monomers: styrene, hydroxystyrene, hydroxyethyl (meth)acrylate, hydroxypropyl(meth)acrylate, methyl(meth)acrylate, ethyl(meth)acrylate, (meth)acrylic acid, poly(hydroxystyrene-styrene-methacrylate), poly(hydroxystyrene-styrene-methacrylate), poly(4-hydroxystyrene), and poly(pyromellitic dianhydride-ethylene glycol-propylene oxide).

Additionally, as one of ordinary skill in the art will recognize, the above description for the various monomers that may be polymerized to form the polymer resin for the BARC layer 203 are intended to be illustrative and are not intended to limit the embodiments in any fashion. Rather, any suitable monomer or combination of monomers that perform the desired functions of the monomers described herein may also be utilized. All such monomers are fully intended to be included within the scope of the embodiments.

The catalyst may be a compound that is used to generate a chemically active species and initiate a cross-linking reaction between the polymers within the polymer resin and may be, e.g., thermal acid generator, a photoacid generator, or a photobase generator, suitable combinations of these, or the like. In an embodiment in which the catalyst is a thermal acid generator, the catalyst will generate an acid when sufficient heat is applied to the BARC layer 203. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

In an embodiment in which the catalyst is a photoacid generator, the catalyst may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In other embodiment the catalyst may be a photobase generator. In such an embodiment the photobase generator may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like.

The cross-linking agent may also be added to the BARC layer 203. The cross-linking agent reacts with the polymers within the polymer resin within the BARC layer 203 after exposure, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

Specific examples of materials that may be utilized as a cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl)ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy-2-hydroxypropyl)ether, trimethylolmethane tri(3-acetoxy-2-hydroxypropyl)ether, combinations of these, or the like.

Additionally, as one of ordinary skill in the art will recognize, the precise examples listed above regarding the structures and groups that may be used within the polymer resin, the catalyst, and the cross-linking agent are merely intended to be illustrative and are not intended to list every possible structure or groups that may be utilized to form the polymer resin, the catalyst, and the cross-linking agent. Any suitable alternative structures and any suitable alternative groups may be used to form the polymer resin, the catalyst, and the cross-linking agent, and all such structures and groups are fully intended to be included within the scope of the embodiments.

The individual components of the BARC layer 203 may be placed into the BARC solvent in order to aid in the mixing and placement of the BARC layer 203. To aid in the mixing and placement of the BARC layer 203, the solvent is chosen at least in part based upon the materials and monomers chosen for the polymer resin of the BARC layer 203 as well as the catalyst and the cross-linking agent. In particular, the BARC solvent is chosen such that the polymer resin, the catalyst, and the cross-linking agent can be evenly dissolved into the BARC solvent and dispensed upon the substrate 201 and the fins 701.

In an embodiment the BARC solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the BARC solvent include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cello solve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the solvent component of the BARC layer 203 are merely illustrative and are not intended to limit the embodiments. Rather, any suitable material that may dissolve the polymer resin, the catalyst, and the cross-linking agent may alternatively be utilized to help mix and apply the BARC layer 203. All such materials are fully intended to be included within the scope of the embodiments.

Additionally, other components may also be added into the material for the BARC layer 203 if desired. For example, in an embodiment the monomeric dyes, surface leveling agents, adhesion promoters, anti-foaming agent, and the like, may alternatively be utilized. Any suitable additive may be added into the material for the BARC layer 203, and all such additives are fully intended to be included within the scope of the embodiments.

In an embodiment the polymer resins, the catalyst, and the cross-linking agent, along with any desired additives or other agents, are added to the BARC solvent to form the material for the BARC layer 203. The polymer resins may have a concentration of between about 0.1% and about 30%, such as about 10%, the catalyst may have a concentration of between about 0.1% and about 30%, such as about 5%, and the cross-linking agent may have a concentration of between about 10% and about 20%, such as about 5%.

Once added, the mixture is then mixed in order to achieve an even and constant composition throughout the material for the BARC layer 203 in order to ensure that there are no defects caused by an uneven mixing or non-constant composition of the material for the BARC layer 203. Once mixed together, the material for the BARC layer 203 may either be stored prior to its usage or else used immediately.

Once the material for the BARC layer 203 has been prepared, the material for the BARC layer 203 may be utilized by initially applying the material for the BARC layer 203 onto the substrate 201. The material for the BARC layer 203 may be applied to the substrate 201 so that the material for the BARC layer 203 coats an upper exposed surface of the substrate 201, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the BARC layer 203 may be applied such that it has a thickness over a top of the substrate 201 of between about 50 nm and about 500 nm, such as about 300 nm.

Once the BARC layer 203 has been applied to the substrate 201, a pre-bake of the BARC layer 203 is performed in order to initiate a cross-linking reaction between the polymers within the polymer resin and the cross-linking agent as well as to dry the BARC layer 203 prior to the application of the photoresist 207. The curing and drying of the BARC layer 203 removes a portion of the BARC solvent components but leaves behind the polymers, the catalysts, the cross-linking agent, and other additives. In an embodiment the pre-bake may be performed at a temperature suitable to evaporate the BARC solvent and initiate the cross-linking reaction, such as between about 40° C. and 150° C., although the precise temperature depends upon the materials chosen for the BARC layer 203. The pre-bake is performed for a time sufficient to cure and dry the BARC layer 203, such as between about 10 seconds to about 5 minutes, such as about 90 seconds.

The intermediate mask layer 205 may be placed over the BARC layer 203. In an embodiment the intermediate mask layer 205 is a hard mask material such as silicon nitride, oxides, oxynitrides, silicon carbide, combinations of these, or the like. The hard mask material for the intermediate mask layer 205 may be formed through a process such as chemical vapor deposition (CVD), although other processes, such as plasma enhanced chemical vapor deposition (PECVD), low pressure chemical vapor deposition (LPCVD), spin-on coating, or even silicon oxide formation followed by nitridation, may alternatively be utilized. Any suitable method or combination of methods to form or otherwise place the hardmask material may be utilized, and all such methods or combination are fully intended to be included within the scope of the embodiments. The intermediate mask layer 205 may be formed to a thickness of between about 100 Å and about 800 Å, such as about 300 Å.

In an embodiment the photoresist 207 is applied over the intermediate mask layer 205 and includes a photoresist polymer resin along with one or more photoactive compounds (PACs) in a photoresist solvent. In an embodiment the photoresist polymer resin may comprise a hydrocarbon structure (such as an alicyclic hydrocarbon structure) that contains one or more groups that will decompose (e.g., acid labile groups) or otherwise react when mixed with acids, bases, or free radicals generated by the PACs (as further described below). In an embodiment the hydrocarbon structure comprises a repeating unit that forms a skeletal backbone of the photoresist polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

Specific structures which may be utilized for the repeating unit of the hydrocarbon structure include methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl(meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxyl)ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate and the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether and the like. Examples of the styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In an embodiment the repeating unit of the hydrocarbon structure may also have either a monocyclic or a polycyclic hydrocarbon structure substituted into it, or else the monocyclic or polycyclic hydrocarbon structure may be the repeating unit, in order to form an alicyclic hydrocarbon structure. Specific examples of monocyclic structures that may be used include bicycloalkane, tricycloalkane, tetracycloalkane, cyclopentane, cyclohexane, or the like. Specific examples of polycyclic structures that may be used include adamantine, norbornane, isobornane, tricyclodecane, tetracycododecane, or the like.

The group which will decompose, otherwise known as a leaving group or, in an embodiment in which the PAC is a photoacid generator, an acid labile group, is attached to the hydrocarbon structure so that it will react with the acids/bases/free radicals generated by the PACs during exposure. In an embodiment the group which will decompose may be a carboxylic acid group, a fluorinated alcohol group, a phenolic alcohol group, a sulfonic group, a sulfonamide group, a sulfonylimido group, an (alkylsulfonyl) (alkylcarbonyl)methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that may be utilized for the fluorinated alcohol group include fluorinated hydroxyalkyl groups, such as a hexafluoroisopropanol group. Specific groups that may be utilized for the carboxylic acid group include acrylic acid groups, methacrylic acid groups, or the like.

In an embodiment the photoresist polymer resin may also comprise other groups attached to the hydrocarbon structure that help to improve a variety of properties of the polymerizable resin. For example, inclusion of a lactone group to the hydrocarbon structure assists to reduce the amount of line edge roughness after the photoresist 207 has been developed, thereby helping to reduce the number of defects that occur during development. In an embodiment the lactone groups may include rings having five to seven members, although any suitable lactone structure may alternatively be used for the lactone group.

The photoresist polymer resin may also comprise groups that can assist in increasing the adhesiveness of the photoresist 207 to underlying structures (e.g., the intermediate mask layer 205 and the BARC layer 203). In an embodiment polar groups may be used to help increase the adhesiveness, and polar groups that may be used in this embodiment include hydroxyl groups, cyano groups, or the like, although any suitable polar group may alternatively be utilized.

Optionally, the photoresist polymer resin may further comprise one or more alicyclic hydrocarbon structures that do not also contain a group which will decompose. In an embodiment the hydrocarbon structure that does not contain a group which will decompose may include structures such as 1-adamantyl(meth)acrylate, tricyclodecanyl(meth)acrylate, cyclohexayl(methacrylate), combinations of these, or the like.

Additionally, the photoresist 207 also comprises one or more PACs. The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1] hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenylether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

The individual components of the photoresist 207 may be placed into a photoresist solvent in order to aid in the mixing and placement of the photoresist 207. To aid in the mixing and placement of the photoresist 207, the photoresist solvent is chosen at least in part based upon the materials chosen for the photoresist polymer resin as well as the PACs. In particular, the photoresist solvent is chosen such that the photoresist polymer resin and the PACs can be evenly dissolved into the photoresist solvent and dispensed upon the intermediate mask layer 205 and the BARC layer 203.

In an embodiment the photoresist solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the photoresist solvent for the photoresist 207 include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoetheryl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, dietherylene glycol monoethyl ether, diethylene glycol monbutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, proplyelen glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, methyl lactate, ethyl lactate, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxyl)ethyl, acetate-3-methoxy-3-methylbutyl, acetate-1-methoxy-2-propyl, dipropylene glycol, monomethylether, monoethylether, monopropylether, monobutylehter, monopheylether, dipropylene glycol monoacetate, dioxane, methyl lactate, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; ethyl lactate or methyl lactate, methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, ethyl lactate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, or the like.

However, as one of ordinary skill in the art will recognize, the materials listed and described above as examples of materials that may be utilized for the photoresist solvent component of the photoresist 207 are merely illustrative and are not intended to limit the embodiments. Rather, any suitable material that may dissolve the photoresist polymer resin and the PACs may alternatively be utilized to help mix and apply the photoresist 207. All such materials are fully intended to be included within the scope of the embodiments.

Additionally, while individual ones of the above described materials may be used as the photoresist solvent for the photoresist 207, in alternative embodiments more than one of the above described materials may be utilized. For example, the photoresist solvent may comprise a combination mixture of two or more of the materials described. All such combinations are fully intended to be included within the scope of the embodiments.

The photoresist solvent for the photoresist 207, in an embodiment, may also be filtered in a similar fashion as the negative tone developer 101, as described above with respect to FIGS. 1A-1D. For example, the photoresist solvent may be manufactured, filtered, and stored such that the photoresist solvent comes into contact with fluorine-based polymers and does not come into contact with materials that contain polyethylene. As such, the hydrophobic photoresist solvent will not leach materials into the photoresist solvent and thereby prevent materials from causing defects during the semiconductor manufacturing process.

Optionally, a photoresist cross-linking agent may also be added to the photoresist 207. The photoresist cross-linking agent reacts with the photoresist polymer resin within the photoresist 207 after exposure, assisting in increasing the cross-linking density of the photoresist, which helps to improve the resist pattern and resistance to dry etching. In an embodiment the photoresist cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, combinations of these, or the like.

Specific examples of materials that may be utilized as a photoresist cross-linking agent include melamine, acetoguanamine, benzoguanamine, urea, ethylene urea, or glycoluril with formaldehyde, glycoluril with a combination of formaldehyde and a lower alcohol, hexamethoxymethylmelamine, bismethoxymethylurea, bismethoxymethylbismethoxyethylene urea, tetramethoxymethylglycoluril, and tetrabutoxymethylglycoluril, mono-, di-, tri-, or tetra-hydroxymethylated glycoluril, mono-, di-, tri-, and/or tetra-methoxymethylated glycoluril, mono-, di-, tri-, and/or tetra-ethoxymethylated glycoluril, mono-, di-, tri-, and/or tetra-propoxymethylated glycoluril, and mono-, di-, tri-, and/or tetra-butoxymethylated glycoluril, 2,3-dihydroxy-5-hydroxymethylnorbornane, 2-hydroy-5,6-bis(hydroxymethyl) norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane, tetramethoxymethyl glycoluril, methylpropyltetramethoxymethyl glycoluril, and methylphenyltetramethoxymethylglycoluril, 2,6-bis(hydroxymethyl)p-cresol, N-methoxymethyl- or N-butoxymethyl-melamine. Additionally, compounds obtained by reacting formaldehyde, or formaldehyde and lower alcohols with amino group-containing compounds, such as melamine, acetoguanamine, benzoguanamine, urea, ethylene urea and glycoluril, and substituting the hydrogen atoms of the amino group with hydroxymethyl group or lower alkoxymethyl group, examples being hexamethoxymethylmelamine, bismethoxymethyl urea, bismethoxymethylbismethoxyethylene urea, tetramethoxymethyl glycoluril and tetrabutoxymethyl glycoluril, copolymers of 3-chloro-2-hydroxypropyl methacrylate and methacrylic acid, copolymers of 3-chloro-2-hydroxypropyl methacrylate and cyclohexyl methacrylate and methacrylic acid, copolymers of 3-chloro-2-hydroxypropyl methacrylate and benzyl methacrylate and methacrylic acid, bisphenol A-di(3-chloro-2-hydroxypropyl)ether, poly(3-chloro-2-hydroxypro-pyl)ether of a phenol novolak resin, pentaerythritol tetra(3-chloro-2-hydroxypropyl)ether, trimethylolmethane tri(3-chloro-2-hydroxypropyl)ether phenol, bisphenol A-di(3-acetoxy-2-hydroxypropyl)ether, poly(3-acetoxy-2-hydroxypropyl)ether of a phenol novolak resin, pentaerythritol tetra(3-acetoxy-2-hydroxypropyl)ether, pentaerythritol poly(3-chloroacetoxy- 2-hydroxypropyl)ether, trimethylolmethane tri(3-acetoxy-2-hydroxypropyl)ether, combinations of these, or the like.

In addition to the photoresist polymer resins, the PACs, the photoresist solvents, and the photoresist cross-linking agents, the photoresist 207 may also include a number of other additives that will assist the photoresist 207 obtain the highest resolution. For example, the photoresist 207 may also include surfactants in order to help improve the ability of the photoresist 207 to coat the surface on which it is applied. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Another additive that may be added to the photoresist 207 is a quencher, which may be utilized to inhibit diffusion of the generated acids/bases/free radicals within the photoresist, which helps the resist pattern configuration as well as to improve the stability of the photoresist 207 over time. In an embodiment the quencher is an amine such as a second lower aliphatic amine, a tertiary lower aliphatic amine, or the like. Specific examples of amines that may be used include trimethylamine, diethylamine, triethylamine, di-n-propylamine, tri-n-propylamine, tripentylamine, diethanolamine, and triethanolamine, alkanolamine, combinations of these, or the like.

Alternatively, an organic acid may be utilized as the quencher. Specific embodiments of organic acids that may be utilized include malonic acid, citric acid, malic acid, succinic acid, benzoic acid, salicylic acid, phosphorous oxo acid and its derivatives such as phosphoric acid and derivatives thereof such as its esters, such as phosphoric acid, phosphoric acid di-n-butyl ester and phosphoric acid diphenyl ester; phosphonic acid and derivatives thereof such as its ester, such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phosphinic acid and phenylphosphinic acid.

Another additive that may be added to the photoresist 207 is a stabilizer, which assists in preventing undesired diffusion of the acids generated during exposure of the photoresist 207. In an embodiment the stabilizer may include nitrogenous compounds such as aliphatic primary, secondary, and tertiary amines, cyclic amines such as piperidines, pyrrolidines, morpholines, aromatic heterocycles such as pyridines, pyrimidines, purines, imines such as diazabicycloundecene, guanidines, imides, amides, and others. Alternatively, ammonium salts may also be used for the stabilizer, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Yet another additive that may be added to the photoresist 207 may be a dissolution inhibitor in order to help control dissolution of the photoresist 207 during development. In an embodiment bile-salt esters may be utilized as the dissolution inhibitor. Specific examples of materials that may be utilized include cholic acid (IV), deoxycholic acid (V), lithocholic acid (VI), t-butyl deoxycholate (VII), t-butyl lithocholate (VIII), and t-butyl-3-α-acetyl lithocholate (IX).

Another additive that may be added to the photoresist 207 may be a plasticizer. Plasticizers may be used to reduce delamination and cracking between the photoresist 207 and underlying layers (e.g., the intermediate mask layer 205 and the BARC layer 203) and may comprise monomeric, loigomeric, and polymeric plasticizers such as oligo-anpolyethyl-eneglycol ethers, cycloaliphatic esters, and non-acid reactive steroidally-derived materials. Specific examples of materials that may be used for the plasticizer include dioctyl phthalate, didodecyl phthalate, triethylene glycol dicaprylate, dimethyl glycol phthalate, tricresyl phosphate, dioctyl adipate, dibutyl sebacate, triacetyl glycerine and the like.

Yet another additive that may be added include a coloring agent, which helps observers examine the photoresist 207 and find any defects that may need to be remedied prior to further processing. In an embodiment the coloring agent may be either a triarylmethane dye or, alternatively, may be a fine particle organic pigment. Specific examples of materials that may be used as coloring agents include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045) rhodamine 6G (C. I. 45160), Benzophenone compounds such as 2,4-dihydroxybenzophenone and 2,2',4,4'-tetrahydroxybenzophenone, salicylic acid compounds such as phenyl salicylate and 4-t-butylphenyl salicylate, phenylacrylate compounds such as ethyl-2-cyano-3,3-diphenylacrylate, and 2'-ethylhexyl-2-cyano-3,3-diphenylacrylate, benzotriazole compounds such as 2-(2-hydroxy-5-methylphenyl)-2H-benzotriazole, and 2-(3-t-butyl-2-hydroxy-5-methylphenyl)-5-chloro-2H-benzotriazole, coumarin compounds such as 4-methyl-7-diethylamino-1-benzopyran-2-one, thioxanthone compounds such as diethylthioxanthone, stilbene compounds, naphthalic acid compounds, azo dyes, Phthalocyanine blue, phthalocyanine green, iodine green, Victoria blue, crystal violet, titanium oxide, carbon black, naphthalene black, Photopia methyl violet, bromphenol blue and bromcresol green, laser dyes such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives may also be added to the photoresist 207 in order to promote adhesion between the photoresist 207 and an underlying layer upon which the photoresist 207 has been applied (e.g., the intermediate mask layer 205 and the BARC layer 203). In an embodiment the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles; organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations of these, or the like.

Surface leveling agents may additionally be added to the photoresist 207 in order to assist a top surface of the photoresist 207 to be level so that impinging light will not be adversely modified by an unlevel surface. In an embodiment surface leveling agents may include fluoroaliphatic esters, hydroxyl terminated fluorinated polyethers, fluorinated ethylene glycol polymers, silicones, acrylic polymer leveling agents, combinations of these, or the like.

In an embodiment the photoresist polymer resin and the PACs, along with any desired additives or other agents, are added to the photoresist solvent for application. Once added, the mixture is then mixed in order to achieve an even composition throughout the photoresist 207 in order to ensure that there are no defects caused by an uneven mixing or non-constant composition of the photoresist 207. Once mixed together, the photoresist 207 may either be stored prior to its usage or else used immediately.

Once ready, the photoresist 207 may be utilized by initially applying the photoresist 207 onto the intermediate mask layer 205 and the BARC layer 203. The photoresist 207 may be applied to the intermediate mask layer 205 so that the photoresist 207 coats an upper exposed surface of the intermediate mask layer 205, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 207 may be applied such that it has a thickness over the surface of the intermediate mask layer 205 of between about 10 nm and about 300 nm, such as about 150 nm.

Once the photoresist 207 has been applied to the semiconductor substrate, a pre-bake of the photoresist 207 is performed in order to cure and dry the photoresist 207 prior to exposure to finish the application of the photoresist 207. The curing and drying of the photoresist 207 removes the photoresist solvent component while leaving behind the photoresist polymer resin, the PACs, the photoresist cross-linking agents, and the other chosen additives. In an embodiment the pre-bake may be performed at a temperature suitable to evaporate the photoresist solvent, such as between about 40° C. and 150° C., although the precise temperature depends upon the materials chosen for the photoresist 207. The pre-bake is performed for a time sufficient to cure and dry the photoresist 207, such as between about 10 seconds to about 5 minutes, such as about 90 seconds.

Figure 3:
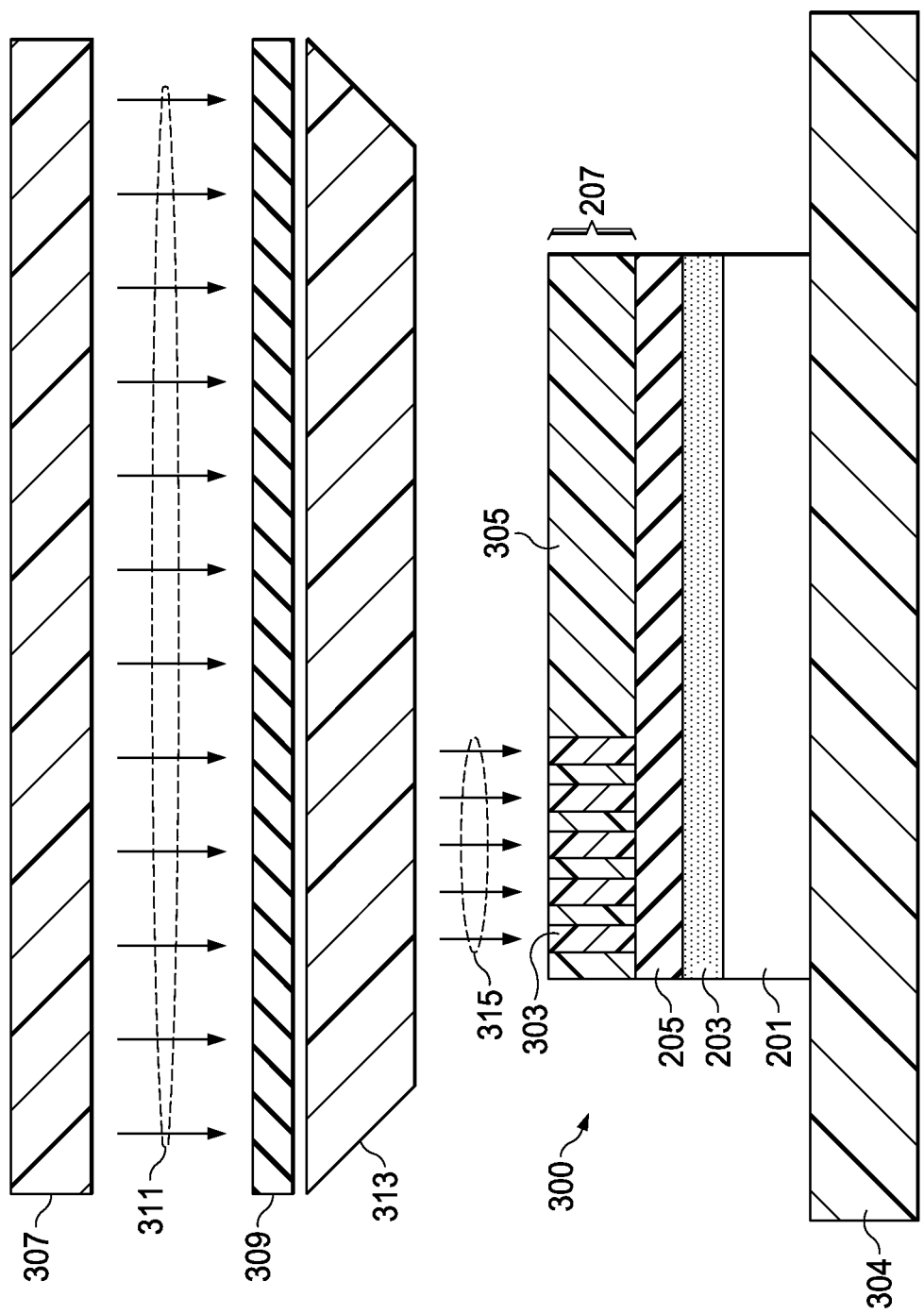
FIG. 3 illustrates an exposure of the photoresist in accordance with some embodiments.

FIG. 3 illustrates that, once applied, the photoresist 207 may be exposed to form an exposed region 303 and an unexposed region 305 within the photoresist 207. In an embodiment the exposure may be initiated by placing the substrate 201 and the photoresist 207, once cured and dried, into a photoresist imaging device 300 for exposure. The photoresist imaging device 300 may comprise a photoresist support plate 304, a photoresist energy source 307, a patterned mask 309 between the photoresist support plate 304 and the photoresist energy source 307, and photoresist optics 313. In an embodiment the photoresist support plate 304 is a surface to which the semiconductor device 200 and the photoresist 207 may be placed or attached to and which provides support and control to the substrate 201 during exposure of the photoresist 207. Additionally, the photoresist support plate 304 may be movable along one or more axes, as well as providing any desired heating or cooling to the substrate 201 and photoresist 207 in order to prevent temperature gradients from affecting the exposure process.

In an embodiment the photoresist energy source 307 supplies photoresist energy 311 such as light to the photoresist 207 in order to induce a reaction of the PACs, which in turn reacts with the photoresist polymer resin to chemically alter those portions of the photoresist 207 to which the photoresist energy 311 impinges. In an embodiment the photoresist energy 311 may be electromagnetic radiation, such as g-rays (with a wavelength of about 436 nm), i-rays (with a wavelength of about 365 nm), ultraviolet radiation, far ultraviolet radiation, x-rays, electron beams, or the like. The photoresist energy source 307 may be a source of the electromagnetic radiation, and may be a KrF excimer laser light (with a wavelength of 248 nm), an ArF excimer laser light (with a wavelength of 193 nm), a F2 excimer laser light (with a wavelength of 157 nm), or the like, although any other suitable source of photoresist energy 311, such as mercury vapor lamps, xenon lamps, carbon arc lamps or the like, may alternatively be utilized.

The patterned mask 309 is located between the photoresist energy source 307 and the photoresist 207 in order to block portions of the photoresist energy 311 to form a patterned energy 315 prior to the photoresist energy 311 actually impinging upon the photoresist 207. In an embodiment the patterned mask 309 may comprise a series of layers (e.g., substrate, absorbance layers, anti-reflective coating layers, shielding layers, etc.) to reflect, absorb, or otherwise block portions of the photoresist energy 311 from reaching those portions of the photoresist 207 which are not desired to be illuminated. The desired pattern may be formed in the patterned mask 309 by forming openings through the patterned mask 309 in the desired shape of illumination.

Optics (represented in FIG. 3 by the trapezoid labeled 313) may be used to concentrate, expand, reflect, or otherwise control the photoresist energy 311 as it leaves the photoresist energy source 307, is patterned by the patterned mask 309, and is directed towards the photoresist 207. In an embodiment the photoresist optics 313 comprise one or more lenses, mirrors, filters, combinations of these, or the like to control the photoresist energy 311 along its path. Additionally, while the photoresist optics 313 are illustrated in FIG. 3 as being between the patterned mask 309 and the photoresist 207, elements of the photoresist optics 313 (e.g., individual lenses, mirrors, etc.) may also be located at any location between the photoresist energy source 307 (where the photoresist energy 311 is generated) and the photoresist 207.

In an embodiment the semiconductor device 200 with the photoresist 207 is placed on the photoresist support plate 304. Once the pattern has been aligned to the semiconductor device 200, the photoresist energy source 307 generates the desired photoresist energy 311 (e.g., light) which passes through the patterned mask 309 and the photoresist optics 313 on its way to the photoresist 207. The patterned energy 315 impinging upon portions of the photoresist 207 induces a reaction of the PACs within the photoresist 207. The chemical reaction products of the PACs' absorption of the patterned energy 315 (e.g., acids/bases/free radicals) then reacts with the photoresist polymer resin, chemically altering the photoresist 207 in those portions that were illuminated through the patterned mask 309.

In a specific example in which the patterned energy 315 is a 193 nm wavelength of light, the PAC is a photoacid generator, and the group to be decomposed is a carboxylic acid group on the hydrocarbon structure and a cross linking agent is used, the patterned energy 315 will impinge upon the photoacid generator and the photoacid generator will absorb the impinging patterned energy 315. This absorption initiates the photoacid generator to generate a proton (e.g., a H+ atom) within the photoresist 207. When the proton impacts the carboxylic acid group on the hydrocarbon structure, the proton will react with the carboxylic acid group, chemically altering the carboxylic acid group and altering the properties of the photoresist polymer resin in general. The carboxylic acid group will then react with the photoresist cross-linking agent to cross-link with other photoresist polymer resins within the photoresist 207.

Optionally, the exposure of the photoresist 207 may occur using an immersion lithography technique. In such a technique an immersion medium (not individually illustrated in FIG. 3) may be placed between the photoresist imaging device 300 (and particularly between a final lens of the photoresist optics 313) and the photoresist 207. With this immersion medium in place, the photoresist 207 may be patterned with the patterned energy 315 passing through the immersion medium.

In this embodiment a protective layer (also not individually illustrated in FIG. 3) may be formed over the photoresist 207 in order to prevent the immersion medium from coming into direct contact with the photoresist 207 and leaching or otherwise adversely affecting the photoresist 207. In an embodiment the protective layer is insoluble within the immersion medium such that the immersion medium will not dissolve it and is immiscible in the photoresist 207 such that the protective layer will not adversely affect the photoresist 207. Additionally, the protective layer is transparent so that the patterned energy 315 may pass through the protective layer without hindrance.

In an embodiment the protective layer comprises a protective layer resin within a protective layer solvent. The material used for the protective layer solvent is, at least in part, dependent upon the components chosen for the photoresist 207, as the protective layer solvent should not dissolve the materials of the photoresist 207 so as to avoid degradation of the photoresist 207 during application and use of the protective layer. In an embodiment the protective layer solvent includes alcohol solvents, fluorinated solvents, and hydrocarbon solvents.

Specific examples of materials that may be utilized for the protective layer solvent include methanol, ethanol, 1-propanol, isopropanol, n-propanol, 1-butanol, 2-butanol, 2-methyl-2-propanol, 3-methyl-1-butanol, isobutyl alcohol, tert-butyl alcohol, 1-pentanol, 2-pentanol, 3-pentanol, n-hexanol, cyclohecanol, 1-hexanol, 1-heptanol, 1-octanol, 2-hexanol, 2-heptanol, 2-octanol, 3-hexanol, 3-heptanol, 3-octanol, 4-octanol, 2-methyl-2-butanol, 3-methyl-1-butanol, 3-methyl-2-butanol, 2-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,2,3,3,4,4-hexafluoro-1-butanol, 2,2,3,3,4,4,5,5-octafluoro-1-pentanol, 2,2,3,3,4,4,5,5,6,6-decafluoro-1-hexanol, 2,2,3,3,4,4-hexafluoro-1,5-pentanediol, 2,2,3,3,4,4,5,5-octafluoro-1,6-hexanediol, 2,2,3,3,4,4,5,5,6,6,7,7-dodecafluoro-1,8-diol, 2-fluoroanisole, 2,3-difluoroanisole, perfluorohexane, perfluoroheptane, perfluoro-2-pentanone, perfluoro-2-butyltetrahydrofuran, perfluorotetrahydrofuran, perfluorotributylamine, perfluorotetrapentylamine, toluene, xylene and anisole, and aliphatic hydrocarbon solvents, such as n-heptane, n-nonane, n-octane, n-decane, 2-methylheptane, 3-methylheptane, 3,3-dimethylhexane, 2,3,4-trimethylpentane, combinations of these, or the like.

The protective layer resin may, similar to the photoresist 207, comprise a protective layer repeating unit. In an embodiment the protective layer repeating unit may be an acrylic resin with a repeating hydrocarbon structure having a carboxyl group, an alicyclic structure, an alkyl group having one to five carbon atoms, a phenol group, or a fluorine atom-containing group. Specific examples of the alicyclic structure include a cyclohexyl group, an adamantyl group, a norbornyl group, an isobornyl group, a tricyclodecyl group, a tetracyclododecyl group, and the like. Specific examples of the alkyl group include an n-butyl group, an isobutyl group, or the like. However, any suitable protective layer resin may alternatively be utilized.

The protective layer composition may also include additional additives to assist in such things as adhesion, surface leveling, coating, and the like. For example, the protective layer composition may further comprise a protective layer surfactant, although other additives may also be added, and all such additions are fully intended to be included within the scope of the embodiment. In an embodiment the protective layer surfactant may be an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant.

Specific examples of materials that may be used for the protective layer surfactant include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyooxypropylene block copolymers; sorbitan fatty acid esters, such as sorbitan monolaurate, sorbitan monopalmitate, sorbitan monostearate, sorbitan monooleate, sorbitan trioleate and sorbitan tristearate; and polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

Prior to application of the protective layer onto the photoresist 207, the protective layer resin and desired additives are first added to the protective layer solvent to form a protective layer composition. The protective layer solvent is then mixed to ensure that the protective layer composition has a consistent concentration throughout the protective layer composition.

Once the protective layer composition is ready for application, the protective layer composition may be applied over the photoresist 207. In an embodiment the application may be performed using a process such as a spin-on coating process, a dip coating method, an air-knife coating method, a curtain coating method, a wire-bar coating method, a gravure coating method, a lamination method, an extrusion coating method, combinations of these, or the like. In an embodiment the photoresist 207 may be applied such that it has a thickness over the surface of the photoresist 207 of about 100 nm.

After the protective layer composition has been applied to the photoresist 207, a protective layer pre-bake may be performed in order to remove the protective layer solvent. In an embodiment the protective layer pre-bake may be performed at a temperature suitable to evaporate the protective layer solvent, such as between about 40° C. and 150° C., although the precise temperature depends upon the materials chosen for the protective layer composition. The protective layer pre-bake is performed for a time sufficient to cure and dry the protective layer composition, such as between about 10 seconds to about 5 minutes, such as about 90 seconds.

Once the protective layer has been placed over the photoresist 207, the semiconductor device 200 with the photoresist 207 and the protective layer are placed on the photoresist support plate 304, and the immersion medium may be placed between the protective layer and the photoresist optics 313. In an embodiment the immersion medium is a liquid having a refractive index greater than that of the surrounding atmosphere, such as having a refractive index greater than 1. Examples of the immersion medium may include water, oil, glycerine, glycerol, cycloalkanols, or the like, although any suitable medium may alternatively be utilized.

The placement of the immersion medium between the protective layer and the photoresist optics 313 may be done using, e.g., an air knife method, whereby fresh immersion medium is applied to a region between the protective layer and the photoresist optics 313 and controlled using pressurized gas directed towards the protective layer to form a barrier and keep the immersion medium from spreading. In this embodiment the immersion medium may be applied, used, and removed from the protective layer for recycling so that there is fresh immersion medium used for the actual imaging process.

However, the air knife method described above is not the only method by which the photoresist 207 may be exposed using an immersion method. Any other suitable method for imaging the photoresist 207 using an immersion medium, such as immersing the entire substrate 201 along with the photoresist 207 and the protective layer, using solid barriers instead of gaseous barriers, or using an immersion medium without a protective layer, may also be utilized. Any suitable method for exposing the photoresist 207 through the immersion medium may be used, and all such methods are fully intended to be included within the scope of the embodiments.

After the photoresist 207 has been exposed to the patterned energy 315, a post-exposure baking may be used in order to assist in the generating, dispersing, and reacting of the acid/base/free radical generated from the impingement of the patterned energy 315 upon the PACs during the exposure. Such assistance helps to create or enhance chemical reactions which generate chemical differences between the exposed region 303 and the unexposed region 305 within the photoresist 207. These chemical differences also caused differences in the solubility between the exposed region 303 and the unexposed region 305. In an embodiment this post-exposure baking may occur at temperatures of between about 50° C. and about 160° C. for a period of between about 40 seconds and about 120 seconds.

Figure 4A:
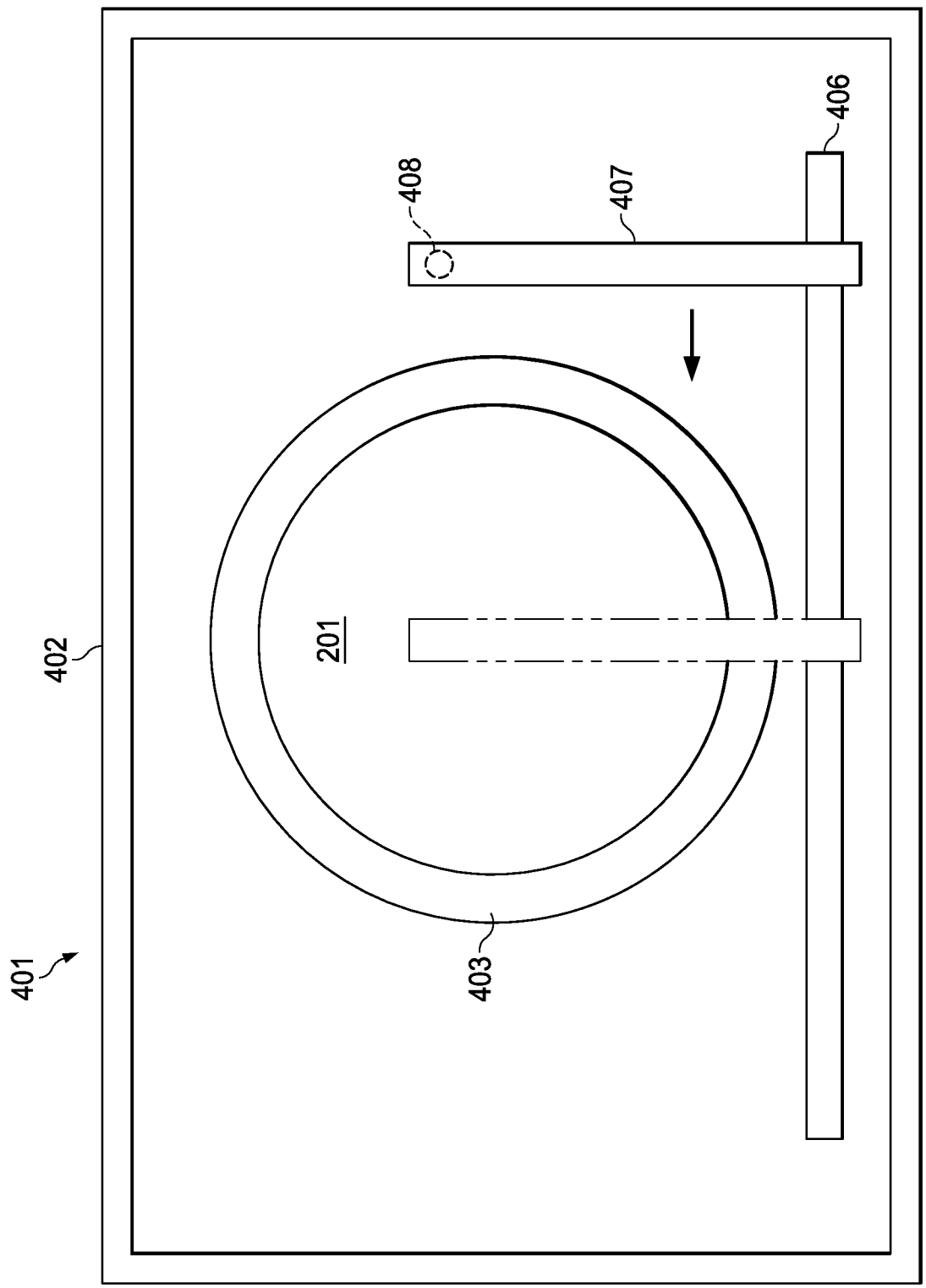
FIGS. 4A-4B illustrate a developer station in accordance with some embodiments.
Figure 4B:
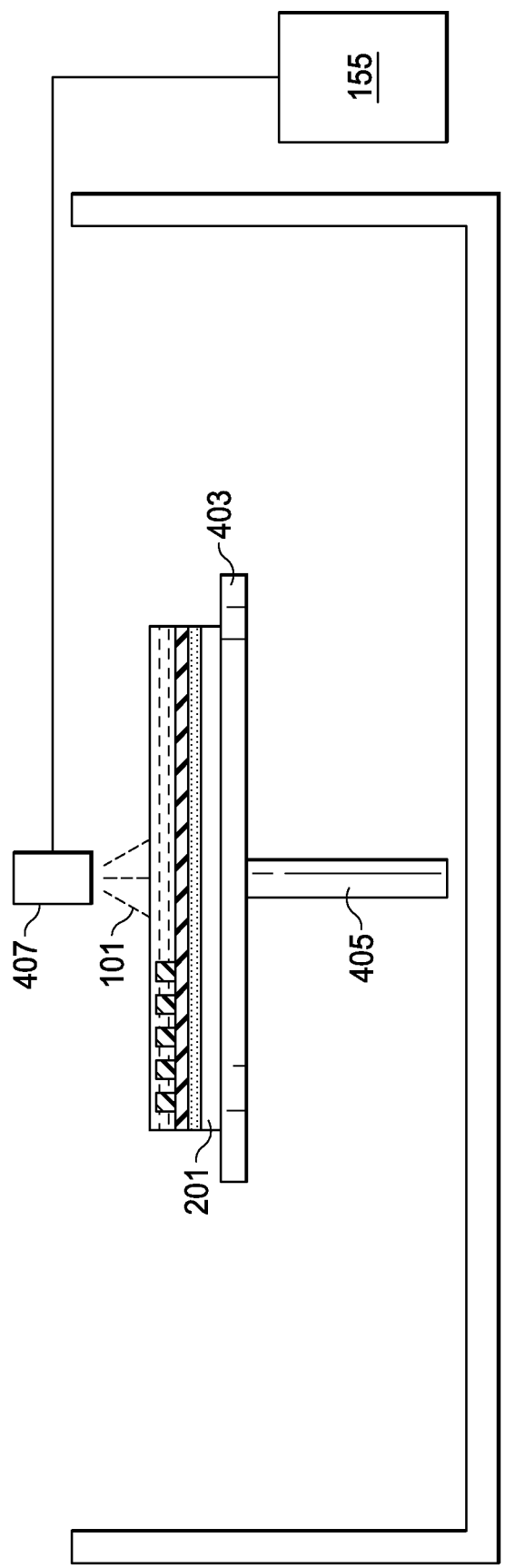

FIGS. 4A-4B illustrates a top-down view and a representative cross-sectional view of an embodiment of the negative tone developer station 401 in which the negative tone developer station 401 uses a spin-on method to apply the negative tone developer 101. In an embodiment the negative tone developer station 401 comprises a rotating developer chuck 403 attached to a rotating spindle 405. A negative tone developer dispensing arm 407 with a negative tone developer nozzle 408 (on a negative tone developer track 406) is operably connected to the first process tank 151 (e.g., through the pipe 153) so that the first process tank 151 supplies fresh negative tone developer 101 to the negative tone developer dispensing arm 407. A housing 402 surrounds and protects the various pieces of equipment within the negative tone developer station 401.

In an embodiment the substrate 201 is placed onto the rotating developer chuck 403 and is held in place using, e.g., a vacuum pressure from below the rotating developer chuck 403. The rotating spindle 405 to which the rotating developer chuck 403 is attached is engaged, thereby rotating the rotating developer chuck 403, the substrate 201, and the photoresist 207, at a speed of between about 500 rpm and about 3500 rpm. Once the photoresist 207 is rotating at the desired speed, the negative tone developer dispensing arm 407 moves over the rotating photoresist 207 and begins to dispense the negative tone developer 101 out of the negative tone developer nozzle 408 at a rate of between about 0.5 cc/sec and about 20 cc/sec, at a temperature of between about 10° C. and about 50° C., such as about 50° C., for a period of time between about 10 second and about 60 minutes, such as about 30 minutes.

In an embodiment in which immersion lithography is utilized to expose the photoresist 207 and a protective layer is utilized to protect the photoresist 207 from the immersion medium, the negative tone developer 101 may be chosen to remove not only those portions of the photoresist 207 that are desired to be removed, but may also be chosen to remove the protective layer in the same development step. Alternatively, the protective layer may be removed in a separate process, such as by a separate solvent from the negative tone developer 101 or even an etching process to remove the protective layer from the photoresist 207 prior to development.

However, while the spin-on method and configuration described herein for the negative tone developer station 401 is one suitable method for developing the photoresist 207 in the negative tone developer station 401, it is intended to be illustrative and is not intended to limit the embodiment. Rather, the negative tone developer station 401 may comprise any mechanism and chemicals in any configuration for any type of development process, include a dip process configuration, a puddle process configuration, combinations of these, or the like. All such development processes and configuration for the negative tone developer station 401 are fully intended to be included within the scope of the embodiments.

Figure 5:
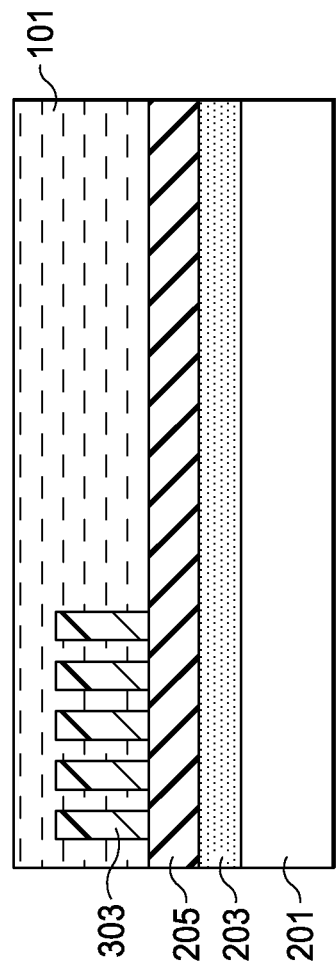
FIG. 5 illustrates a cross-section of a photoresist during development in accordance with some embodiments.

FIG. 5 illustrates a cross-sectional view of the application of the negative tone developer 101 onto the photoresist 207. In an embodiment the negative tone developer 101 will dissolve the unexposed regions 305 of the photoresist 207 that were not exposed to the patterned energy 315. This dissolving will leave behind the exposed regions 303 of the photoresist 207 that had been exposed to the patterned energy 315, thereby transferring the pattern of the patterned energy 315 to the photoresist 207. Once finished, the negative tone developer 101 may be removed by stopping the dispensing of the negative tone developer 101 while keeping the substrate 201 spinning to remove the negative tone developer 101 and performing an optional rinse with, e.g., deionized water.

Once the substrate 201 and the photoresist 207 have been developed and the negative tone developer 101 has been removed, a first hard bake may optionally be used to help polymerize and stabilize the photoresist 207 after the development process, and also aid in improving the adhesion of the photoresist 207 to the underlying layers. In an embodiment the first hard bake may be performed in a first hard bake station (not individually illustrated in FIG. 5) with a hot plate and heating elements located within the hot-plate. However, any suitable type of heating station, such as a furnace or steam-heating station, may alternatively be utilized. In an embodiment in which the first hard bake station is a hot-plate station, the substrate 201 with the photoresist 207 is placed onto the hot-plate and the heating elements are engaged to raise the temperature of the photoresist 207 to between about 70° C. to about 130° C. The photoresist 207 may be kept at this temperature for between about 1 minute to about 3 minutes.

Figure 6:
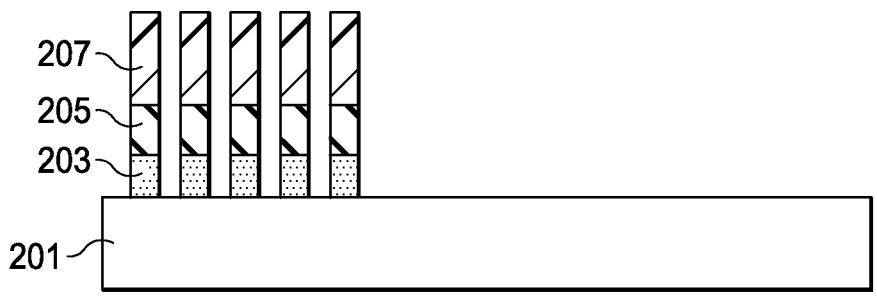
FIG. 6 illustrates a patterning of a BARC layer in accordance with an some embodiments.

FIG. 6 illustrates that, once the photoresist 207 has been developed, the photoresist 207 may be utilized as a mask in order to pattern the intermediate mask layer 205 and the BARC layer 203, effectively transferring the pattern of the patterned mask 215 to the intermediate mask layer 205 and the BARC layer 203. In an embodiment the transfer may be performed using, e.g., one or more reactive ion etches (RIE) with the photoresist 207 in place, wherein the one or more reactive ion etches (RIE) are performed with etchants selective to the intermediate mask layer 205 and the BARC layer 203, respectively, although any other suitable types of removal processes may alternatively be used.

Figure 7:
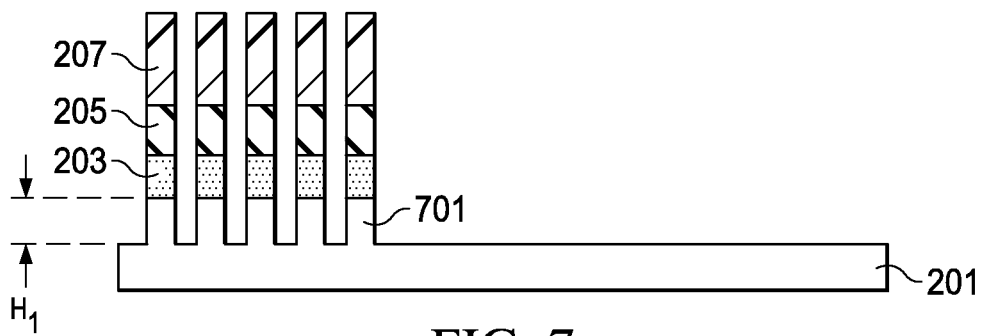
FIG. 7 illustrates a formation of fins in accordance with some embodiments.

FIG. 7 illustrates that, once the pattern of the photoresist 207 has been transferred to the BARC layer 203, the same pattern may then be transferred to the substrate 201 to form fins 701 for finFET devices (e.g., finFET transistors). In an embodiment the pattern of the BARC layer 203 may be transferred into the substrate 201 using, e.g., a reactive ion etch with an etchant selective to the material of the substrate 201 (e.g., silicon). The etch may be continued to form fins 701 with a first height $H_1$ of between about 5 nm and about 500 nm, such as about 100 nm, although any suitable height may alternatively be utilized.

However, by using the negative tone developer 101 which has not been processed by any equipment that contains polyethylene, there will be no leaching of polyethylene into the negative tone developer 101. As such, no particles of polyethylene will be present during the developing process to cause defects to occur, and the number of defects caused by polyethylene particles within the developing and subsequent etching processes will be reduced or eliminated. This leads to an increase in efficiency and yields.

Once the fins 701 have been formed in the substrate 201, multiple-gate transistors may be formed from the fins 701. In an embodiment, a gate dielectric layer (not illustrated) and a gate electrode layer (also not illustrated) may be deposited over the fins 701 and then patterned to form a gate dielectric and a gate electrode over a channel region of the fins 701. Source/drain regions may then be implanted into the exposed portions of the fins 701, spacers may be formed, and contacts may be formed to the gate electrode and source/drain regions, to form connected multiple gate finFETs from the fins 701.

Figure 8:
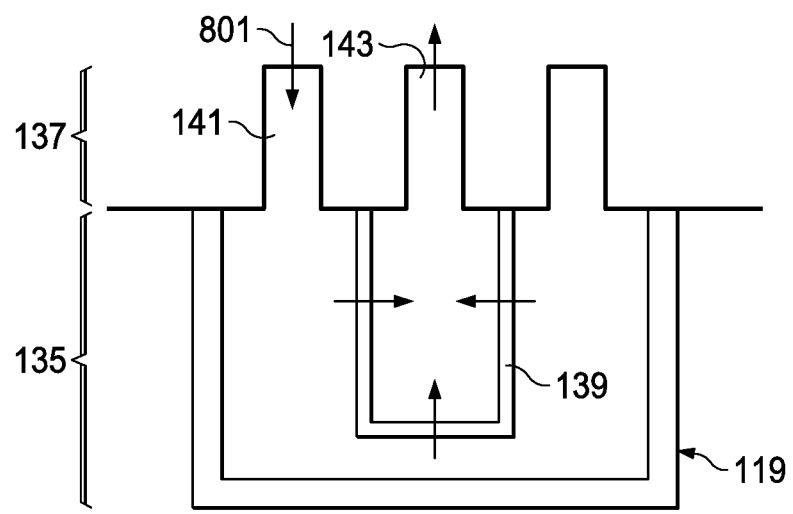
FIG. 8 illustrates a cleaning process that may be used to clean a filter in accordance with some embodiments.

FIG. 8 illustrates additional methods that may be used in conjunction with the second filter 119 in order to help ensure that particles are captured by the second filter 119 and do not encounter the substrate 201 during the semiconductor manufacturing process. In one embodiment a filter-pre-wash may be performed prior to using the second filter 119 to filter the negative tone developer 101. In an embodiment, the second filter membrane 139 may be pre-rinsed by a buffer liquid 801 prior to using the second filter 119 for filtering the negative tone developer 101. By using the buffer liquid 801, an interface between the second filter membrane 139 and surrounding gases (e.g., air) is interrupted and bubbles adjacent to the second filter membrane 139 are removed, thereby lowering the surface energy difference between the second filter membrane 139 and subsequently filtered negative tone developer 101.

In an embodiment the buffer liquid 801 may be a water-based, aqueous solution, comprising one or more buffer materials. Alternatively, the buffer liquid 801 may be a solvent-based solution, such as an organic solvent-based solution, or even a hybrid solution of water and solvent-based solutions, and may also comprise either acids or bases. In a particular embodiment, used negative tone developer 101 (e.g., negative tone developer 101 that has already been used to develop a photoresist and has been recovered from the process) may be utilized as the buffer liquid 801. However, any suitable solution may alternatively be utilized.

In an embodiment, at least one of the buffer materials within the buffer liquid 801 has a surface tension below the negative tone developer 101 which will be filtered. For example, if the negative tone developer 101 has a surface tension of 30 dynes/cm, then at least one of the buffer materials within the buffer liquid 801 may have a surface tension of less than about 30 dynes/sm. By utilizing a buffer material with a lower surface tension, then the buffer materials within the buffer liquid 801 will be able to interrupt the gas/filter membrane 139 interface better than the negative tone developer 101. By interrupting this interface and removing the gasses located along this interface, the buffer materials within the buffer liquid 801 will reduce the impact of the interface, allowing the negative tone developer 101 to be filtered with less resistance.

In a particular embodiment the at least one of the buffer materials within the buffer liquid 801 will also have a surface energy that is relatively similar to the filter membrane 139. For example, in an embodiment a gap between the surface energy of the at least one of the buffer materials and the filter membrane 139 may be less than about 40 dynes/cm.

In an embodiment the buffer materials may be a liquid with similar surface properties as the filter membrane 139. For example, in an embodiment in which the second filter membrane 139 is hydrophobic, the buffer materials may be a hydrophobic solvent such as an alkane or alkene. Additionally, the alkane or alkene may comprise one or more functional groups such as an alcohol group, and aldehyde group, a ketone group, and ester group, an amine group, a carboxylic acid group, combinations of these, or the like. Particular embodiments for the buffer materials include N-Methyl-2-pyrrolidone (NMP, which has a surface tension of about 41 dynes/cm), propylene glycol methyl ether acetate (PGMEA, which has a surface tension of about 28 dynes/cm), cyclohexanone (CHN, which has a surface tension of about 35 dynes/cm), propylene glycol ethyl ether (PGEE, which has a surface tension of about 27.8 dynes/sm), gamma-butyrolactone (GBL, which has a surface tension of about 35.4 dynes/cm), isopropyl alcohol (IPA, which has a surface tension of about 21 dynes/cm), combinations of these, or the like, whose structures are respectively illustrated below.

The buffer materials may be used as a liquid by themselves. Alternatively, in an embodiment in which the buffer liquid 801 is a solution with an organic solvent or an aqueous solution, the buffer materials may have a concentration within the buffer liquid 801 of between about 0.01 wt % and about 40 wt %, such as about 1 wt %. However, any suitable concentration may alternatively be used.

Additionally, the buffer liquid 801 may comprise a surfactant. For example, the buffer liquid 801 may also include surfactants in order to help improve the ability of the buffer liquid 801 to coat the surface of the second filter membrane 139. In an embodiment the surfactants may include nonionic surfactants, polymers having fluorinated aliphatic groups, surfactants that contain at least one fluorine atom and/or at least one silicon atom, polyoxyethylene alkyl ethers, polyoxyethylene alkyl aryl ethers, polyoxyethylene-polyoxypropylene block copolymers, sorbitan fatty acid esters, polyoxyethylene sorbitan fatty acid esters.

Specific examples of materials that may be used as surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

In an embodiment the buffer liquid 801 may be contacted to the filter membrane 139 prior to using the second filter 119 to filter the negative tone developer 101 in a number of ways. In a first embodiment the buffer liquid 801 may be pumped, poured, injected, or otherwise inserted into the second filter basin 135, where it will come into physical contact with the second filter membrane 139. Once the second filter membrane 139 has been wetted by the buffer liquid 801, the buffer liquid 801 may be left in contact with the second filter membrane 139 until the second filter 119 is ready to be used in order to prevent the second filter membrane 139 from drying out and the gas/filter membrane 139 interface from reappearing. To minimize exterior interference, the second inlet port 141 and the second outlet port 143 may be sealed after filling the second filter basin 135 with the buffer liquid 801.

In an embodiment this method of contacting may be performed at the manufacturing site where the second filter 119 will be installed and used. For example, once the second filter 119 has been received from a manufacturer, the customer who received the second filter 119 may perform the pre-rinse prior to installation of the second filter 119 by filling the second filter basin 135 with the buffer liquid 801 and then sealing the buffer liquid 801 into the second filter basin 135. The buffer liquid 801 may be left in the second filter basin 135 (with the second inlet port 141 and the second outlet port 143 sealed), until the second filter 119 is ready to be installed, such as during a maintenance turn-around or other suitable time for installation.

Alternatively, instead of a customer performing the pre-rinse by sealing the buffer liquid 801 into the second filter basin 135, the manufacturer of the second filter 119 may perform the pre-rinse. In this embodiment the manufacturer, after making, cleaning, and drying the second filter 119, may perform the pre-rinse as described above, and leave the buffer liquid 801 in the second filter 119 by sealing the second inlet port 141 and the second outlet port 143. Then, with the buffer liquid 801 still sealed within the second filter 119, the manufacturer can ship the still wet second filter 119 to the customer, where the customer can store the second filter 119 along with the sealed buffer liquid 801 until the customer is ready to install the second filter 119.

In yet another alternative embodiment, the buffer liquid 801 may be pumped through the second filter 119 as part of a cleaning process either before or after the second filter 119 has been installed. In such an embodiment, rather than sealing the buffer liquid 801 into the second filter 119 until it is ready to be installed and used, the buffer liquid 801 is pumped into the second filter 119 at a rate of between about 5 ml/min and about 1500 ml/min, for a time period of between about 5 min and about 15 hrs., such as about 2 hrs. In this way the buffer liquid 801 does not need to remain within the second filter 119 itself, and the second filter 119 does not need to be sealed.

If desired, multiple buffer liquids 801 may be utilized in a succession of pre-rinse steps. For example, a first buffer liquid 801 with a surface energy that is less than 40 dynes/cm from the surface energy of the second filter membrane 139 (so that there is a surface energy gap of less than 40 dynes/cm) may be utilized to initially disrupt the gas/filter membrane 139 interface. Once this has been accomplished, a second buffer liquid 801 with surface energy properties that are closer to the negative tone developer 101 may be used to gradually bridge the difference between surface energies between the negative tone developer 101 and the second filter membrane 139.

For example, in a particular embodiment in which the second filter membrane 139 is a hydrophobic material, a hydrophobic solvent is initially utilized as the buffer liquid 801. Once the hydrophobic solvent has been used, a second buffer liquid 801 that is hydrophylic may be used. In a particular embodiment, this second buffer liquid 801 may be another one of the buffer liquids 801 discussed above or, alternatively, may be an initial amount of the negative tone developer 101 that will not be used for manufacturing but may be used to stabilize the second filter 119 prior to using the second filter 119 during manufacturing processes.

In yet another embodiment the succession of buffer liquids 801 may be incorporated into a cleaning process for the second filter 119. In an embodiment the cleaning process may include various cleaning solutions, such as surfactant solutions, water rinses, and a succession of buffer liquids 801. In a particular embodiment there may be five steps to the cleaning process, including an initial rinse step, a cleaning solution step, a second rinse step to clear the cleaning solution, and the successive two buffer liquids 801. However, the precise sequence of these steps may be modified as desired, and may be based on the cleaning efficiency of the solutions.

Additionally, cleaning solutions with electrostatic effects may be utilized. In a particular, embodiment, the cleaning process may utilize an acidic solution, with a pH of less than about 7 for a Teflon second filter membrane 139. Alternatively, a basic solution may be used, with a pH of greater than about 7, for a Teflon second filter membrane 139. By using a solution that is either acidic or basic (based on the second filter membrane 139), the electrostatic effect of such a solution may help to better clean the second filter membrane 139 within the second filter 119.

Finally, additional physical force may be utilized to aid in the cleaning of the second filter 119. In an embodiment, a higher physical energy may be provided to the cleaning liquids in order to aid in the cleaning of the second filter membrane 139. In an embodiment the buffer liquid 801 may be heated prior to entering the second filter 119. For example, a resistive heater may be utilized to provide additional heat either in a storage tank (not illustrated in FIG. 8) or else, alternatively, in an in-line heater surrounding a pipe in order to heat the buffer liquid 801 to a temperature of between about 25° C. and about 60° C., such as about 28° C.

Alternatively, additional momentum may be added to the buffer liquid 801 to aid in the cleaning process. In an embodiment, an ultrasonic cleaning process may be utilized after the buffer liquid 801 has been added to the second filter 119 in order to assist in the cleaning process. Alternatively, a centrifuge may be utilized in order to impart additional momentum to the buffer liquid 801 so as to assist to break up the gas/second filter membrane 139 interface.

Finally, sheer physical force may also be utilized to help clean the second filter 119. In an embodiment, the buffer liquid 801 may be pressurized to a high pressure prior to entering the second filter 119. For example, the buffer liquid 801 may be pressurized. By provided a higher pressure, the buffer liquid 801 may be physically forced to break up the gas/second filter membrane 139 interface.

In another embodiment, the buffer liquid 801 may be pumped into the second filter 119 in different directions. For example, in one direction, the buffer liquid 801 may be pumped into the second filter 119 through the second inlet port 141. After the buffer liquid 801 has been pumped through the second inlet port 141, a second pump may be attached to the second outlet port 143, and another portion of the buffer liquid 801 may be pumped into the second filter 119 through the second outlet port 143. By using a two way flushing method, the buffer liquid 801 contacts the second filter membrane 139 from two directions, further assisting in cleaning the second filter membrane 139 prior to actual usage.

By utilizing the cleaning methods described above along with the lack of polyethylene within the manufacturing, filtration, and use of the negative tone developer 101, particles may be efficiently removed from the negative tone developer 101 prior to the use of the negative tone developer 101 in a semiconductor manufacturing process. As such, with fewer particles present to deposit upon the photoresist 207 as the photoresist 207 is being patterned, the photoresist 207 will be better able to provide the desired masking properties, thereby leading to fewer defects and a higher yield as dimensions are scaled down, including into the 10 μm process node and beyond.

In accordance with an embodiment, a method of filtering a process fluid comprising introducing a negative tone developer to a filter membrane, wherein the filter membrane comprises a first fluorine-based polymer is provided. The negative tone developer is filtered through the filter membrane.

In accordance with another embodiment, a method of filtering a process fluid comprising filtering a negative tone developer with a first filter to form a filtered negative tone developer, wherein the first filter comprises a first fluorine-based polymer. The filtered negative tone developer is transferred to a first process unit.

In accordance with yet another embodiment, a method of filtering a process fluid comprising installing a filter, wherein the filter comprises a fluorine-based polymer membrane is provided. A negative tone developer is filtered through the filter to form a filtered negative tone developer, and the filtered negative tone developer is dispensed onto an exposed photoresist to form a patterned photoresist.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of filtering a process fluid, the method comprising:
   introducing a negative tone developer to a filter membrane, wherein the filter membrane comprises a first fluorine-based polymer;
   filtering the negative tone developer through the filter membrane; and
   developing a photoresist with the negative tone developer.

2. The method of claim 1, further comprising:
   storing the negative tone developer in a first process tank, wherein the first process tank comprises a second fluorine-based polymer; and
   moving the negative tone developer to a process unit through a pipe, wherein the pipe comprises a third fluorine-based polymer.

3. The method of claim 2, further comprising using the photoresist as a mask to form fins from a substrate.

4. The method of claim 2, further comprising wetting the filter membrane prior to the filtering the negative tone developer through the filter membrane.

5. The method of claim 4, wherein the first fluorine-based polymer comprises polytetrafluorethylene, perfluoroalkoxy, fluorinated ethylene propylene, poly(ethene-co-tetrafluoroethene), or poly(vinylidene fluoride).

6. The method of claim 2, wherein the filter is located within the process unit.

7. The method of claim 1, wherein the negative tone developer does not come into contact with high-density polyethylene throughout the method.

8. A method of filtering a process fluid, the method comprising:
   filtering a negative tone developer with a first filter to form a filtered negative tone developer, wherein the first filter comprises a first fluorine-based polymer;
   transferring the filtered negative tone developer to a first process unit; and
   developing a negative tone photoresist with the negative tone developer within the first process unit to form a developed negative tone photoresist.

9. The method of claim 8, further comprising:
   removing a portion of a substrate beneath the developed photoresist to form fins; and
   forming a plurality of finFETs from the fins.

10. The method of claim 8, further comprising storing the filtered negative tone developer in a first process tank, the first process tank comprising a second fluorine-based polymer.

11. The method of claim 10, further comprising storing the filtered negative tone developer in a first container prior to the storing the filtered negative tone developer in the first process tank.

12. The method of claim 11, further comprising storing the negative tone developer in a second container prior to the filtering the negative tone developer, wherein the second container comprises a second fluorine-based polymer.

13. The method of claim 12, further comprising pre-wetting the filter before the filtering the negative tone developer.

14. The method of claim 8, further comprising cleaning the filter prior to the filtering the negative tone developer.

15. A method of filtering a process fluid, the method comprising:
- installing a filter, wherein the filter comprises a fluorine-based polymer membrane;
- filtering a negative tone developer through the filter to form a filtered negative tone developer; and
- dispensing the filtered negative tone developer onto an exposed photoresist to remove portions of the exposed photoresist and form a patterned photoresist.

16. The method of claim 15, further comprising receiving the filter and pre-washing the filter prior to the installing the filter.

17. The method of claim 15, wherein the negative tone developer is free from contact with polyethylene from the filter to the photoresist.

18. The method of claim 15, wherein the fluorine based polymer membrane comprises polytetrafluorethylene, perfluoroalkoxy, fluorinated ethylene propylene, poly(ethene-co-tetrafluoroethene), or poly(vinylidene fluoride).

19. The method of claim 15, further comprising rinsing the filter with a buffer liquid, wherein the buffer liquid has a surface tension lower than the negative tone developer.

20. The method of claim 15, further comprising removing a portion of a substrate using the patterned photoresist.

* * * * *